(12) United States Patent
Marutani

(10) Patent No.: US 10,790,424 B2
(45) Date of Patent: Sep. 29, 2020

(54) METHOD OF MANUFACTURING LIGHT-EMITTING DEVICE, AND LIGHT-EMITTING DEVICE

(71) Applicant: NICHIA CORPORATION, Anan-shi, Tokushima (JP)

(72) Inventor: Yukitoshi Marutani, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/006,761

(22) Filed: Jun. 12, 2018

(65) Prior Publication Data

US 2018/0358521 A1 Dec. 13, 2018

(30) Foreign Application Priority Data

Jun. 13, 2017 (JP) .................................. 2017-115975

(51) Int. Cl.
*H01L 27/15* (2006.01)
*H01L 29/26* (2006.01)
(Continued)

(52) U.S. Cl.
CPC ............ *H01L 33/60* (2013.01); *H01L 33/508* (2013.01); *H01L 33/58* (2013.01); *H01L 33/62* (2013.01);
(Continued)

(58) Field of Classification Search
CPC ....... H01L 33/60; H01L 33/58; H01L 33/508; H01L 33/62; H01L 2933/0058;
(Continued)

(56) References Cited

U.S. PATENT DOCUMENTS 7,932,531 B2 * 4/2011 Lin ....................... H01L 21/563
257/98
9,670,385 B2 * 6/2017 Namiki ................... H01L 33/62
(Continued)

FOREIGN PATENT DOCUMENTS

JP 2011-257487 A 12/2011
JP 2012-142362 A 7/2012
(Continued)

*Primary Examiner* — Ismail A Muse
(74) *Attorney, Agent, or Firm* — Foley & Lardner LLP

(57) ABSTRACT

A method of manufacturing a light-emitting device includes: providing a substrate having: a first surface, a second surface opposite to the first surface, a first through-hole extending from the first surface to the second surface, and wiring on the first surface; mounting a light-emitting element on the first surface to electrically connect an electrode of the light-emitting element and the wiring; providing a cover member having a concave portion for accommodating the light-emitting element; disposing the cover member such that the cover member faces the first surface of the substrate and the concave portion accommodates the light-emitting element and leads to the first through-hole; forming a light-transmissive resin in the concave portion such that a cavity is formed between (i) part of the first surface of the substrate around the light-emitting element and (ii) the light-transmissive resin; and injecting a reflective resin material into the cavity and the first through-hole.

26 Claims, 13 Drawing Sheets

(51) Int. Cl.
  *H01L 31/12* (2006.01)
  *H01L 33/00* (2010.01)
  *H01L 33/60* (2010.01)
  *H01L 33/50* (2010.01)
  *H01L 33/62* (2010.01)
  *H01L 33/58* (2010.01)
  H01L 33/48 (2010.01)
  H01L 33/64 (2010.01)

(52) U.S. Cl.
  CPC .......... *H01L 33/486* (2013.01); *H01L 33/505* (2013.01); *H01L 33/642* (2013.01); *H01L 2933/005* (2013.01); *H01L 2933/0058* (2013.01)

(58) Field of Classification Search
  CPC ............. H01L 2933/005; H01L 33/642; H01L 33/505; H01L 33/486
  See application file for complete search history.

(56) References Cited

U.S. PATENT DOCUMENTS

| | | | |
|---|---|---|---|
| 2004/0000727 | A1 | 1/2004 | Hsu |
| 2009/0321918 | A1* | 12/2009 | Lin ....................... H01L 21/563 257/690 |
| 2012/0193665 | A1* | 8/2012 | Yamada .................. H01L 24/17 257/98 |
| 2012/0193666 | A1* | 8/2012 | Namiki .............. C08G 18/8175 257/98 |
| 2012/0274203 | A1 | 11/2012 | Yokotani |
| 2013/0037842 | A1* | 2/2013 | Yamada .................. H01L 33/60 257/98 |
| 2013/0087825 | A1* | 4/2013 | Umakoshi ............... H01L 33/60 257/99 |
| 2013/0188381 | A1 | 7/2013 | Kotani |
| 2013/0193458 | A1* | 8/2013 | Mochizuki .............. H01L 27/15 257/88 |
| 2013/0264602 | A1* | 10/2013 | Namiki ................... H01L 33/60 257/98 |
| 2014/0061684 | A1* | 3/2014 | Marutani ................ H01L 33/62 257/88 |
| 2014/0140079 | A1* | 5/2014 | Marutani ................ F21V 21/14 362/418 |
| 2015/0181711 | A1* | 6/2015 | Nakabayashi ........ H01L 33/647 257/99 |
| 2015/0216037 | A1 | 7/2015 | Tomita et al. |
| 2015/0236230 | A1* | 8/2015 | Miyata .................... H01L 33/62 257/98 |
| 2015/0311139 | A1* | 10/2015 | Kim, II ............... H01L 23/4985 438/15 |
| 2016/0029485 | A1* | 1/2016 | Dummer ................ H05K 1/181 362/382 |
| 2016/0190405 | A1* | 6/2016 | Yamada .................. H01L 33/54 257/88 |
| 2017/0358716 | A1* | 12/2017 | Park ....................... H01L 33/486 |
| 2018/0097165 | A1* | 4/2018 | Marutani ................ H01L 33/62 |
| 2018/0145233 | A1* | 5/2018 | Tokunaga ................ H01L 33/58 |
| 2018/0175265 | A1* | 6/2018 | Kim ....................... H01L 33/60 |

FOREIGN PATENT DOCUMENTS

| | | |
|---|---|---|
| JP | 2012-231036 A | 11/2012 |
| JP | 2013-012545 A | 1/2013 |
| JP | 2013-069843 A | 4/2013 |
| JP | 2013-149906 A | 8/2013 |
| JP | 2015-164177 A | 9/2015 |
| JP | 2016-154204 A | 8/2016 |

\* cited by examiner

METHOD OF MANUFACTURING LIGHT-EMITTING DEVICE, AND LIGHT-EMITTING DEVICE

CROSS-REFERENCE TO RELATED APPLICATION

This application claims priority to Japanese Patent Application No. 2017-115975, filed on Jun. 13, 2017, the disclosure of which is hereby incorporated by reference in its entirety.

BACKGROUND

The present disclosure relates to a method of manufacturing a light-emitting device and to the light-emitting device.

Light-emitting devices such as light-emitting diodes are used as light sources for lighting apparatuses as an alternative to incandescent lamps and fluorescent lamps, because light-emitting devices have low power consumption, high luminance, and longer lifetime, as disclosed in Japanese Unexamined Patent Application Publication No. 2012-231036. Light-emitting devices have recently also been brought into use as light sources for wearable devices, as disclosed in Japanese Unexamined Patent Application Publication No. 2015-164177.

It is expected that light-emitting devices can emit light with lower power consumption and high luminance, which requires light-emitting devices with high light extraction efficiency.

Also, in recent years, it is also expected for substrates to be less likely to deteriorate in light-emitting devices in which light-emitting elements are mounted on the substrates.

Accordingly, one object of certain embodiments of the present disclosure is to provide a method of manufacturing a light-emitting device that is high light extraction efficiency and allows a substrate less likely to deteriorate on which a light-emitting element is mounted, and to provide the light-emitting device.

SUMMARY

According to one embodiment, a method of manufacturing a light-emitting device according includes: providing a substrate having a first surface, a second surface opposite to the first surface, at least one through-hole formed from the first surface to the second surface, and wiring on the first surface; mounting a light-emitting element on the first surface of the substrate to electrically connect an electrode of the light-emitting element and the wiring; providing a cover member having a concave portion for accommodating the light-emitting element; disposing the cover member such that the cover member faces the first surface of the substrate and that the concave portion accommodates the light-emitting element and leads to the at least one through-hole; forming a light-transmissive resin in the concave portion such that a cavity is formed between part of the first surface of the substrate around the light-emitting element and the light-transmissive resin; and injecting a reflective resin material into the cavity and the at least one through-hole.

According to another embodiment, a light-emitting device includes: a substrate having a first surface and a second surface opposite to the first surface; a light-emitting element disposed on the first surface of the substrate; a light-transmissive resin disposed on or above the first surface of the substrate to cover the light-emitting element; and a reflective resin disposed between the substrate and the light-transmissive resin. The reflective resin is in contact with the light-emitting element, is disposed on part of the first surface of the substrate around the light-emitting element, and has a region in which a thickness thereof increases as a distance from the light-emitting element increases. The substrate has a through-hole formed from the first surface to the second surface. The reflective resin extends into the through-hole.

According to certain embodiments of the present disclosure, methods of manufacturing a light-emitting device enable manufacture of a light-emitting device with high light extraction efficiency in which light emitted from the lateral surfaces of the light-emitting element passes through the light-transmissive resin, is reflected by the reflective resin, and is emitted to the outside.

According to certain embodiments of the present disclosure, light-emitting devices produced by the described methods include a reflective resin that extends into the through-hole, which allows the substrate to be less likely to deteriorate.

DETAILED DESCRIPTION

The following describes light-emitting devices according to embodiments, with reference to the drawings.

First Embodiment

Figure 1A:
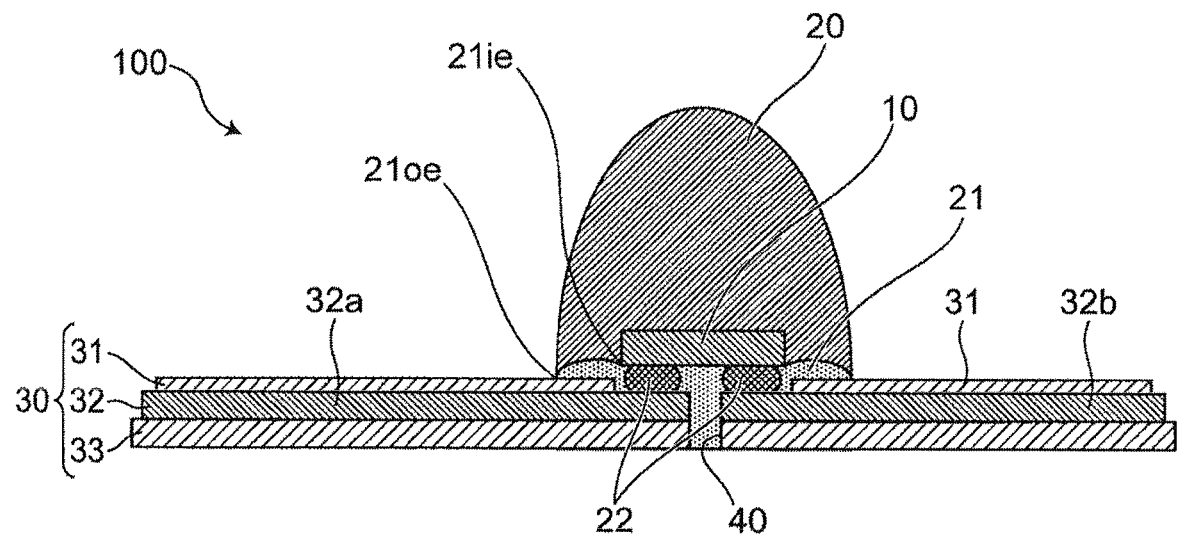
FIG. 1A is a schematic sectional view of a light-emitting device according to a first embodiment.
Figure 1B:
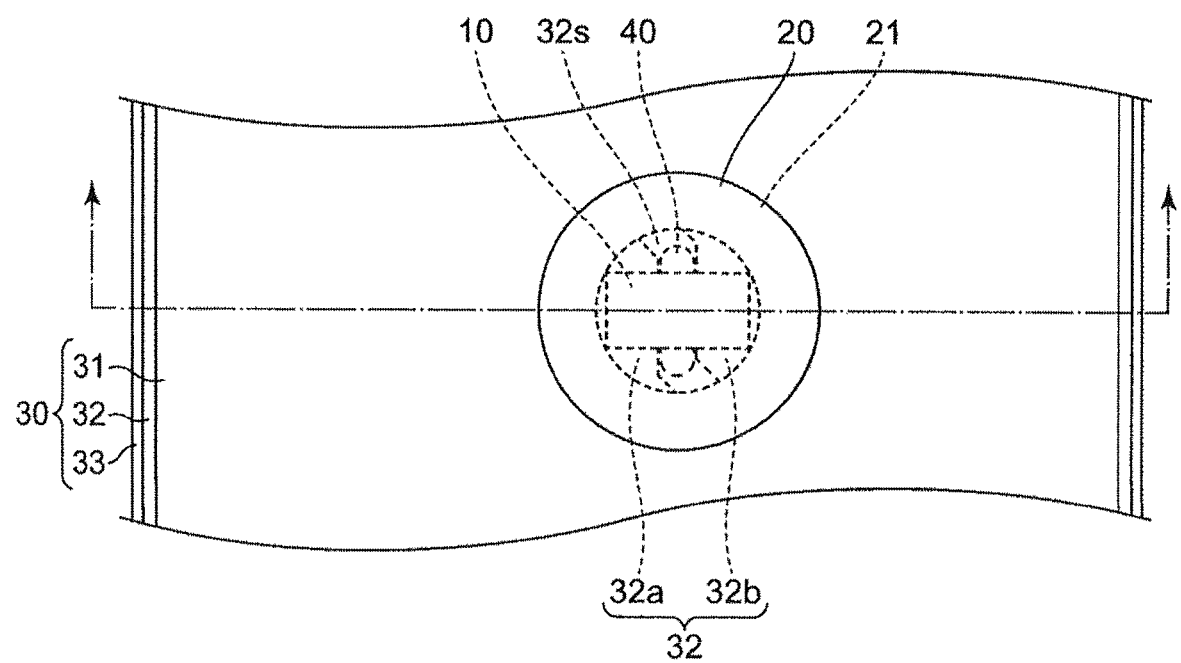
FIG. 1B is a schematic plan view of the light-emitting device according to the first embodiment.

A light-emitting device 100 according to a first embodiment includes a substrate 30, a light-emitting element 10 disposed on a first surface of the substrate 30, a light-transmissive resin 20 covering the light-emitting element 10 on or above the substrate 30, and a reflective resin 21 disposed between part of the substrate 30 around the light-emitting element 10 and the light-transmissive resin 20 as shown in FIG. 1A. The substrate 30 includes a base member 33, a wiring layer 32 disposed on the base member 33, and an insulating resin film 31 that covers part of the wiring layer 32 such that another part of the wiring layer 32 is exposed.

The light-emitting device 100 according to the first embodiment includes a region in which the thickness of the reflective resin 21 increases as the distance from the light-emitting element 10 increases. The reflective resin 21 extends into a through-hole 40 formed through the substrate 30 near the light-emitting element 10 from the first surface to a second surface opposite to the first surface. The light-emitting device 100 according to the first embodiment having the above structure includes the region (hereinafter referred to as a first inclined region) in which the thickness of the reflective resin 21 disposed between part of the substrate 30 around the light-emitting element 10 and the light-transmissive resin 20 increases as the distance from the light-emitting element 10 increases. Therefore, light laterally emitted from the light-emitting element 10 can be reflected by the first inclined region, so that the light can be extracted upward. Also, the reflective resin 21 extends into the through-hole 40, thereby alleviating irradiation of the substrate 30 with light emitted from the light-emitting element 10.

In the light-emitting device 100 according to the first embodiment, first wiring 32a and second wiring 32b are disposed separately on the first surface of the substrate 30. The light-emitting element 10 includes positive and negative electrodes on the same surface and is flip-chip bonded (also called face-down mounted or junction-down mounted). The positive electrode is bonded to the first wiring 32a with one of electrically-conductive connecting members 22, and the negative electrode is connected to the second wiring 32b with another one of the electrically-conductive connecting members 22. The reflective resin 21 is disposed to embed the electrically-conductive connecting members 22. In the light-emitting device 100 according to the first embodiment having the above structure, the reflective resin 21 embeds the electrically-conductive connecting members 22 in a region between the first surface of the substrate 30 and the light-emitting element 10, while extending into the through-hole 40 as described above. In this structure, either of the electrically-conductive connecting members 22 and the reflective resin 21 that do not substantially transmit light is disposed between the light-emitting element 10 and the substrate 30. Hence, irradiation of the substrate 30 with light emitted from the light-emitting element is alleviated, thereby alleviating deterioration of the substrate 30 even in the case where, for example, the base member 33 of the substrate 30 is formed using a resin that absorbs light emitted from the light-emitting element.

In the light-emitting device 100 according to the first embodiment, it is preferable that the upper end of an inner circumferential edge 2 lie of the reflective resin 21 disposed around the light-emitting element 10 substantially coincide with the lower ends of the lateral surfaces of the light-emitting element 10. This structure enables light emitted from the lateral surfaces of the light-emitting element 10 to be efficiently reflected and extracted upward, thereby more effectively enhancing the upward extraction efficiency.

The light-emitting device 100 according to the first embodiment also includes a region (hereinafter referred to as a second inclined region) in which the thickness of the reflective resin 21 disposed around the light-emitting element 10 increases as the distance from an outer circumferential edge 21oe of the reflective resin 21 increases. The outer circumferential edge 21oe of the reflective resin 21 may substantially coincide with the lower end of the outer circumference of the light-transmissive resin 20.

In the light-emitting device 100 according to the first embodiment, it is preferable that the central axis of the through-hole 40 in the substrate 30 substantially coincide with the central axis of the light-transmissive resin 20. Also, it is preferable that the central axis of the light distribution of the light-emitting element 10 substantially coincide with the central axis of the light-transmissive resin 20 in order to obtain desired light distribution of the light-emitting device 100. The light-transmissive resin 20 may have a lens-like shape to provide desired light distribution characteristics.

In the light-emitting device 100 according to the first embodiment, the light-transmissive resin 20 may contain a wavelength conversion member that absorbs at least part of light emitted from the light-emitting element 10 and emits light having a wavelength longer than the wavelength of the light emitted from the light-emitting element 10. Alternatively, a wavelength conversion layer that absorbs at least part of light emitted from the light-emitting element 10 and emits light having a wavelength longer than the wavelength of the light emitted from the light-emitting element 10 may be included between the emitting surface of the light-emitting element 10 and the light-transmissive resin 20. Examples of the wavelength conversion member include phosphor particles and quantum dots. Employment of the wavelength conversion member or the wavelength conversion layer can realize a light-emitting device that emits white light as a result of color mixing of, for example, blue light emitted from the light-emitting element 10 and yellow light emitted from the phosphor.

The substrate may be a flexible substrate. Employment of a flexible substrate enables installation along a curved surface and enables use as, for example, a light source for a wearable device.

Main components in the first embodiment will be described below.

<Substrate 30>

The substrate 30 functions as a base on which the light-emitting element 10 and the like are placed to constitute the light-emitting device 100. A flexible substrate, a rigid substrate, or a rigid-flexible substrate, which is a combination of these substrates, can be employed as the substrate 30. Examples of the material for the base member 33 of the substrate 30 include resin materials such as glass epoxy resins, phenolic resins, epoxy resins, polyimide resins, BT resins, polyphthalamide (PPA), polyethylene terephthalate (PET), and polyethylene naphthalate (PEN), and inorganic materials such as ceramics and glass. For example, in the case of focusing on cost reduction, and moldability or processability, a resin material is preferably selected as the material for the base member 33. In the case where a resin material is used as the material for the base member 33, glass fiber or an inorganic filling material, such as $SiO_2$, $TiO_2$, and $Al_2O_3$, can be mixed in the resin to improve the mechanical strength, reduce the thermal expansion coefficient, and improve the light reflectance. Examples of the material for the flexible substrate include polyimide resins, which are used in the form of films. To make the light-emitting device resistant to heat and light, a ceramic can be selected as the material for the insulating base member 33. Examples of the ceramic include alumina, mullite, forsterite, glass ceramics, and nitride (e.g., AlN) and carbide ceramics (e.g., SiC).

<Wiring Layer 32>

The material for the first wiring 32a and the second wiring 32b (hereinafter referred to as "the wiring 32" or "the wiring layer 32" as a general term) can be appropriately selected in consideration of the material for the substrate and manufacturing method of the substrate. The wiring is part of the substrate disposed to electrically connect the positive and negative electrodes of the light-emitting element to an external power supply. For example, in the case where a glass epoxy resin is employed for the base member 33 of the substrate 30, examples of the material for the wiring layer 32 include metals such as copper, aluminum, gold, silver, tungsten, iron, and nickel and metal layers formed using materials such as iron-nickel alloys, phosphor bronze, copper-iron alloys, and molybdenum. In the case where a lead frame formed using any of the above materials is employed, the lead frame and a resin used as the material for the base member 33 can be formed in an integrated manner into the substrate 30. In the case where a ceramic is employed for the insulating base member 33, the material for the wiring layer 32 is preferably a material having a melting point that is high enough to resist sintering temperatures of a ceramic sheet. A metal with a high melting point, such as tungsten and molybdenum, is employed.

<Insulating Resin Film 31>

The insulating resin film 31 is an insulating film that covers the surface of the substrate and protects part of the wiring layer 32. Preferably, the material for the insulating resin film 31 is less likely to absorb light emitted from the light-emitting element. For example, a resin material such as epoxy, silicone, modified silicone, urethane, oxetane, acrylic, polycarbonate, and polyimide resins can be used. The insulating resin film 31 may have light-reflecting properties by incorporating a white filler in order to improve the light extraction efficiency of the light-emitting device.

<Light-Emitting Element 10>

A light-emitting element that emits light having appropriately selected wavelength can be used as the light-emitting element 10. The light-emitting element 10 includes a support substrate, a semiconductor multilayer film including an active layer, electrodes including the positive and negative electrodes, and a protective film that covers part of the semiconductor multilayer film and the electrodes. Examples of a blue or green light-emitting element include a light-emitting element including a group II-VI compound semiconductor such as ZnSe, a nitride mixed-crystal semiconductor ($In_xAl_yGa_{1-x-y}N$, where $0 \leq x$, $0 \leq y$, $x+y \leq 1$), or a group III-V compound semiconductor such as GaP. For example, $Ga_{1-x}Al_xAs$ or $Al_xIn_yGa_{1-x-y}P$ may be employed for a red light-emitting element. Semiconductor light-emitting elements can also be formed using other materials. The composition, emission color, size, and number of the light-emitting element can be selected appropriately depending on the purpose. The positive and negative electrodes of the light-emitting element may be positioned on the same surface or on different surfaces, which can be appropriately selected depending on the purpose. The light-emitting element may be one that includes a phosphor layer serving as the wavelength conversion member on at least a part of the emitting surface of the light-emitting element. Alternatively, the light-emitting element may be one in a small package in which a light-emitting element is encapsulated in a resin containing the wavelength conversion member or the like. A shape and structure of the light-emitting element are not particularly limited.

<Electrically-Conductive Connecting Members 22>

The electrically-conductive connecting members 22 electrically connect the wiring and the light-emitting element 10. Examples of the electrically-conductive connecting members 22 include die-bonding materials, bumps, solder materials, and wires. Examples of an electrically-conductive material used as the electrically-conductive connecting members 22 include Au-containing alloys, Ag-containing alloys, Pd-containing alloys, In-containing alloys, Pb—Pd-containing alloys, Au—Ga-containing alloys, Au—Sn-containing alloys, Sn-containing alloys, Sn—Cu-containing alloys, Sn—Cu—Ag-containing alloys, Au—Ge-containing alloys, Au—Si-containing alloys, Al-containing alloys, Cu—In-containing alloys, mixtures of metals and fluxes, and electrically-conductive adhesives.

<Light-Transmissive Resin 20>

The light-transmissive resin 20 protects the light-emitting element 10 against external environments and optically controls light exiting from the light-emitting element 10. The shape of the light-transmissive resin 20 is defined by the amount of the light-transmissive resin material injected, and the shape of the molds (e.g., metal molds or resin molds) in which a light-transmissive resin material is injected, used in cast molding, injection molding, or compression molding. Examples of the light-transmissive resin material constituting the light-transmissive resin 20 include epoxy resins, silicone resins, and mixtures of these resins. A silicone resin is preferable as the light-transmissive resin material in view of light resistance and moldability. Part of or the whole of the light-transmissive resin 20 may contain a light-diffusing material, a phosphor, and/or a colorant corresponding to the emission color of the light-emitting element. The light-diffusing material diffuses light emitted from the light-emitting element 10. The phosphor serves as the wavelength conversion member that absorbs at least part of light emitted from the light-emitting element and emits light having a wavelength longer than the wavelength of the light emitted from the light-emitting element 10. The viscosity of the light-transmissive resin material at the time of molding can be adjusted to a desired viscosity using the light-diffusing material, the wavelength conversion member, or the colorant.

Examples of the light-diffusing material include inorganic fillers including particles and staple fiber of: oxides such as $SiO_2$, $Al_2O_3$, $Al(OH)_3$, $MgCO_3$, $TiO_2$, $ZrO_2$, ZnO, $Nb_2Os$, MgO, $Mg(OH)_2$, SrO, $In_2O_3$, $TaO_2$, HfO, SeO, $Y_2O_3$, CaO, $Na_2O$, and $B_2O_3$; nitrides such as SiN, AlN, and AlON; and fluorides such as $MgF_2$; as well as organic fillers formed of particulate various resins. The content of the light-diffusing material is not limited as long as it enables light to be diffused. The content is, for example, about 0.01 wt % to 30 wt %, preferably about 2 wt % to 20 wt %. The size of the light-diffusing material is also not limited as long as it enables light to be diffused. The size is, for example, in a range of from about 0.01 μm to about 30 μm, preferably in a range of from about 0.5 μm to about 10 μm. The shape may be spherical or scaly, but is preferably spherical to achieve uniform diffusion.

To enhance the light extraction efficiency of the light-emitting element 10, it is preferable that the light-transmissive resin 20 covers the lateral surfaces of the light-emitting element 10. The light-emitting element 10 mounted by flip-chip bonding usually includes a light-emitting layer near the bottom surface of the light-emitting element 10, which is near the substrate 30. Thus, it is preferable that the inner lower ends of the light-transmissive resin 20 (i.e., ends close to the light-emitting element) substantially coincide with the ends on the lateral surfaces (i.e., lower ends) and also on the bottom surface of the light-emitting element. Hence, the light-transmissive resin 20 is preferably provided using the light-transmissive resin material capable of defining a contact angle of 90° or less with the lateral surface of the light-emitting element.

<Reflective Resin 21>

The reflective resin 21 formed after curing the reflective resin material has light-reflecting properties to light emitted from the light-emitting element 10 and enables efficient reflection of the light emitted from the light-emitting element 10. The reflective resin 21 is disposed around the light-emitting element 10. In the case where the light-emitting element 10 is flip-chip mounted, the reflective resin 21 is disposed between the light-emitting element 10 and the substrate 30 as an underfill material. The underfill material is used as a countermeasure against external force, stress, humidity, and temperature applied on the light-emitting device. The reflective resin 21 contains a filling material (i.e., filler) in order to enable efficient reflection of light emitted from the light-emitting element 10, and to make its thermal expansion coefficient closer to the thermal expansion coefficient of the light-emitting element 10. The material for the reflective resin 21 is not particularly limited as long as the material is an insulating material and is less likely to absorb light emitted from the light-emitting element 10. For example, a resin material such as epoxy, silicone, modified silicone, urethane, oxetane, acrylic, polycarbonate, and polyimide resins can be used.

If the filler contained in the reflective resin 21 is a white filler, light emitted from the light-emitting element and the phosphor is more easily reflected, thereby improving the light extraction efficiency. An inorganic compound is preferably used as the filler. The "white" filler here includes a filler that looks white due to scattering when there is a difference in refractive index between the filler and a material around the filler even in the case where the filler itself is transparent. The reflectance of the filler here is preferably 50% or more, more preferably 70% or more, with respect to emission wavelengths of the light-emitting element and/or the wavelength conversion member. This structure can improve the light extraction efficiency of the light-emitting device.

The particle diameter of the filler is preferably in the range of 1 nm to 10 μm. If the particle diameter of the filler is within this range, the fluidity of the resin as the underfill material is improved, and even a narrow gap can be covered without difficulties. The particle diameter of the filler is preferably in the range of 100 nm to 5 μm, further preferably 200 nm to 2 μm. The shape of the filler may be spherical or scaly. Specific examples of the filler material include: oxides such as $SiO_2$, $Al_2O_3$, $Al(OH)_3$, $MgCO_3$, $TiO_2$, $ZrO_2$, ZnO, $Nb_2Os$, MgO, $Mg(OH)_2$, SrO, $In_2O_3$, $TaO_2$, HfO, SeO, and $Y_2O_3$; nitrides such as SiN, AlN, and AlON; and fluorides such as $MgF_2$. These materials may be used singly or may be used as a mixture. The fluidity and the like of the reflective resin material can be adjusted by appropriately selecting the material and particle diameter of the filler and the properties and amount of the reflective resin material.

The semiconductor multilayer film including the active layer is positioned near the lower ends of the lateral surfaces of the flip-chip bonded light-emitting element 10 as seen from the lateral surface side thereof. It is preferable that the interface between the cured light-transmissive resin and the cured reflective resin material is positioned closer to the substrate 30 than the lateral surfaces of the semiconductor multilayer film in view of light extraction from the light-emitting element 10. In view of heat dissipation from the light-emitting element 10, it is preferable that the gap between the bottom surface of the light-emitting element 10 and the surface of the substrate 30 be filled with, for example, the electrically-conductive connecting members 22 such as solder and the reflective resin 21. The reflective resin 21 can contain a thermal-conductive filler, and also serves as the underfill material. This structure is preferable because the reflective resin 21 (underfill material) is better in thermal conductivity than the light-transmissive resin 20. Accordingly, it is preferable that the lower ends of the lateral surfaces of the light-emitting element 10 substantially coincide with the upper end of the reflective resin material.

A method of manufacturing the light-emitting device 100 according to the first embodiment will be described below.

The light-emitting device 100 according to the first embodiment is characterized by the first inclined region in which the thickness of the reflective resin 21 around the light-emitting element 10 increases as the distance from the light-emitting element 10 increases. This structure enables light laterally emitted from the light-emitting element 10 to be extracted upward by utilizing reflection by the first inclined region.

The method of manufacturing the light-emitting device 100 according to the first embodiment described below has an advantage by including a step of easily and simply forming the reflective resin 21 around the light-emitting element 10. The reflective resin 21 includes the first inclined region in which the thickness of the reflective resin 21 increases as the distance from the light-emitting element 10 increases.

The method of manufacturing the light-emitting device 100 according to the first embodiment will be described below in the order of the sequence of steps.

Providing Substrate

In the method of manufacturing the light-emitting device 100 according to the first embodiment, the substrate 30 is provided. The substrate 30 includes the first wiring 32a and the second wiring 32b that are separated from each other on the first surface (i.e., upper surface), and has the through-hole formed from the first surface (i.e., upper surface) to the second surface (i.e., lower surface). The substrate 30 can be prepared, for example, in the following manner.

Forming Wiring

Figure 2A:
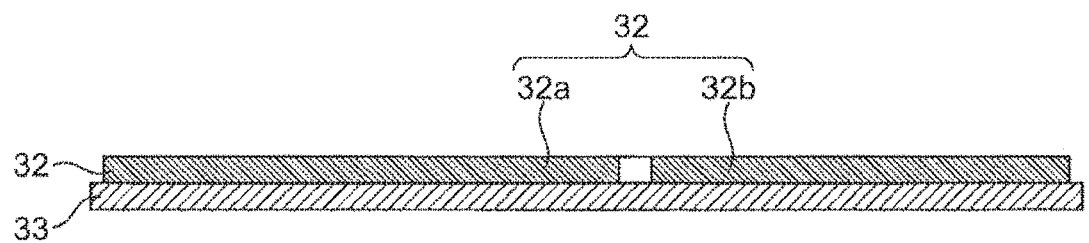
FIG. 2A is a schematic sectional view for illustrating a step of forming wiring in a step of providing a substrate in a method of manufacturing the light-emitting device according to the first embodiment.
Figure 2B:
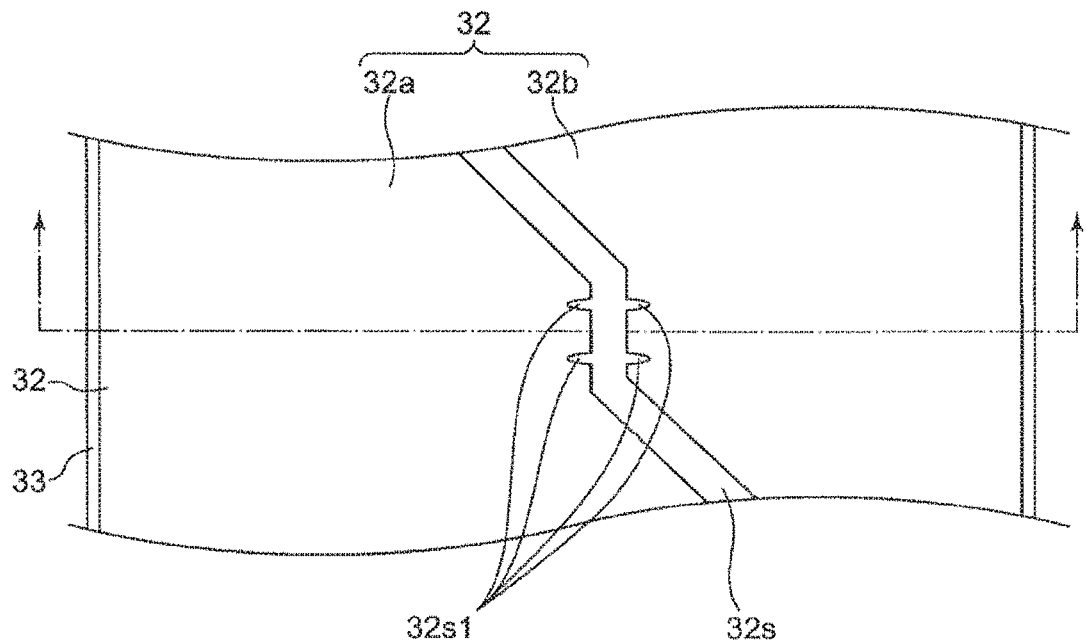
FIG. 2B is a schematic plan view for illustrating the step of forming wiring in the substrate providing step in the method of manufacturing the light-emitting device according to the first embodiment.

First, as shown in FIG. 2A and FIG. 2B, the first wiring 32a and the second wiring 32b separated from each other are formed on the first surface of the substrate 30. The first wiring 32a and the second wiring 32b are formed by, for example, forming a metal film constituting the wiring layer throughout the entire first surface of the substrate 30, and then removing the metal film in a region that is intended to be a separating portion 32s by etching or other methods. The separating portion 32s has a total of four notches 32s1. Two of the notches 32s1 are formed in the first wiring 32a. Other two of the notches 32s1 are formed in the second wiring 32b. The four notches define the positions at which the electrically-conductive connecting members 22 described later are to be formed. The four notches 32s are point symmetric (i.e., two-fold symmetric), and the interval between the two notches 32s1 formed in the first wiring 32a is equal to the interval between the two notches 32s1 formed in the second wiring 32b. As described above, the two notches 32s1 formed in the first wiring 32a and the two notches 32s1 formed in the second wiring 32b have line symmetry with respect to the center line of the separating portion 32s on the first surface of the substrate 30.

Forming Insulating Resin Film

Figure 3A:
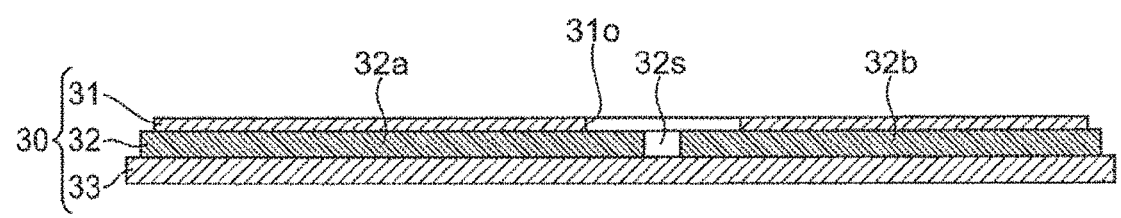
FIG. 3A is a schematic sectional view for illustrating a step of forming an insulating resin film in the substrate providing step in the method of manufacturing the light-emitting device according to the first embodiment.
Figure 3B:
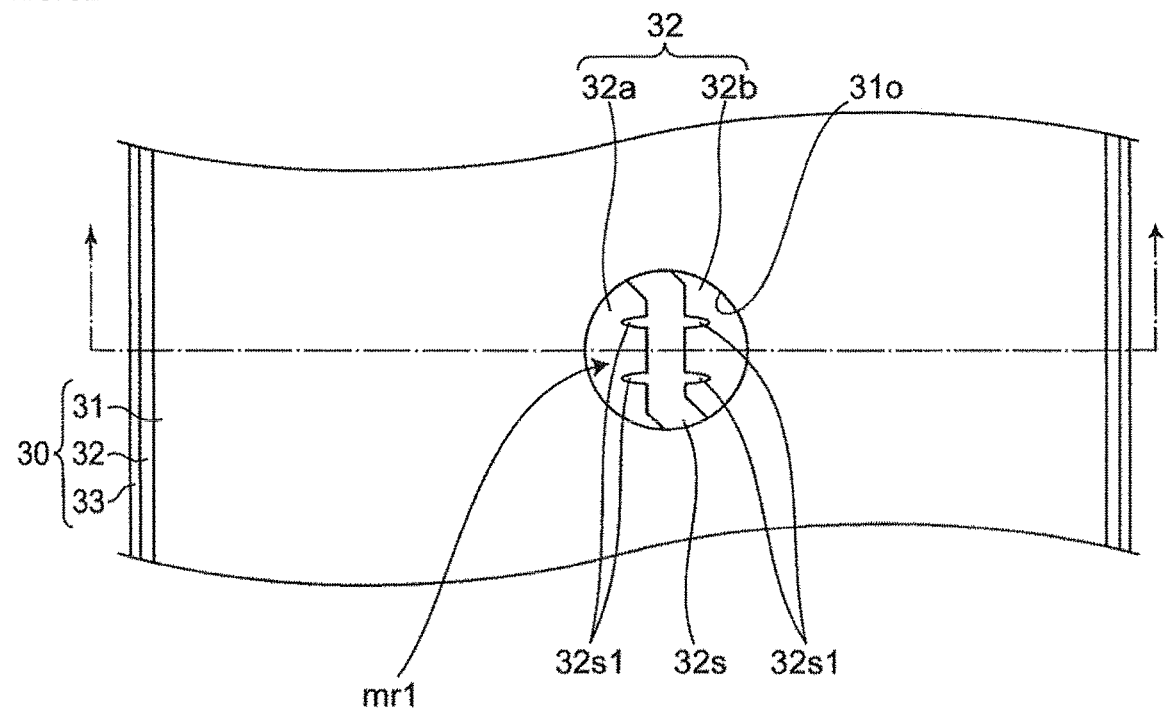
FIG. 3B is a schematic plan view for illustrating the step of forming the insulating resin film in the substrate providing step in the method of manufacturing the light-emitting device according to the first embodiment.

Subsequently, as shown in FIG. 3A and FIG. 3B, the insulating resin film 31 that covers the wiring layer 32 and the separating portion 32s is formed except for a mounting region mr1 on which the light-emitting element 10 is to be mounted. The insulating resin film 31 is formed by, for example, forming an insulating resin film throughout the substantially entire first surface of the substrate 30 to cover the wiring layer 32 and the separating portion 32s, and removing part of the insulating resin film to make an opening 31o, thereby exposing the first wiring 32a and the second wiring 32b separated by the separating portion 32s, in the opening 31o. The insulating resin film 31 is thus formed such that the first wiring 32a and the second wiring 32b separated by the separating portion 32s are exposed in the opening 31o (also referred to as the mounting region mr1). In the mounting region mr1, the separating portion 32s including the four notches 32s1 is exposed, and, for example, the center of the mounting region mr1 coincides with the center of symmetry of the four notches 32s1.

Making Through-Hole

Figure 4A:
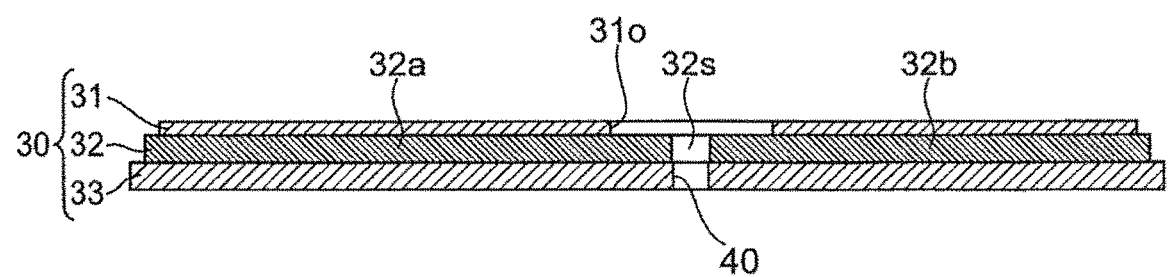
FIG. 4A is a schematic sectional view for illustrating a step of forming a through-hole in the substrate providing step in the method of manufacturing the light-emitting device according to the first embodiment.
Figure 4B:
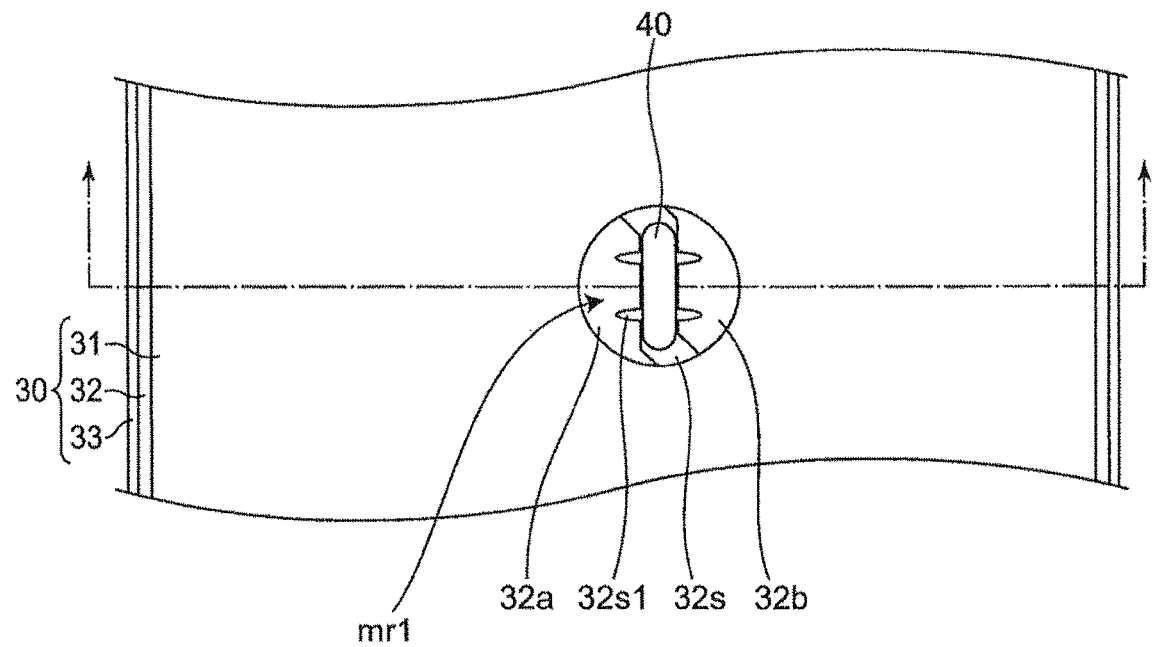
FIG. 4B is a schematic plan view for illustrating the step of forming a through-hole in the substrate providing step in the method of manufacturing the light-emitting device according to the first embodiment.

Subsequently, as shown in FIG. 4A and FIG. 4B, the through-hole 40 formed through the substrate 30 from the first surface to the second surface is formed in the mounting region mr1. In the manufacturing method according to the first embodiment, the through-hole 40 is formed such that, for example, the central axis of the through-hole 40 passes through the center of the mounting region mr1. The through-hole 40 has an elongated sectional shape in one direction in a top view, and is formed such that the major axis of the sectional shape coincides with the center line of the separating portion 32s on the first surface of the substrate 30 and that the length in the major axis direction is longer than the interval between the two notches 32s1 formed in the first wiring 32a (or the interval between the two notches 32s1 formed in the second wiring 32b). The through-hole 40 is preferably formed such that both ends in the major axis direction have a semicircular shape that is outwardly curved as shown in FIG. 4B. This structure corners are not formed on the inner surface of the through-hole 40.

Mounting Light-Emitting Element

Subsequently, the light-emitting element 10 is mounted in the mounting region mr1. An example step of mounting light-emitting element will be described here as a flip-chip mounting using a light-emitting element 10 for face-down mounting including positive and negative electrodes disposed on the same surface, solder employed as the electrically-conductive connecting members 22.

Figure 5A:
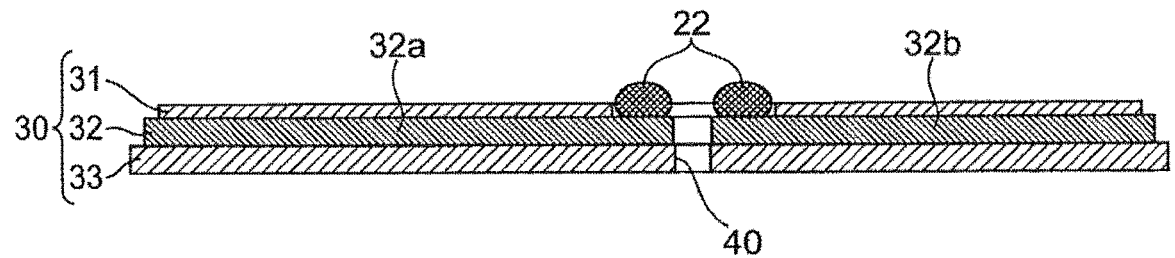
FIG. 5A is a schematic sectional view shown after forming electrically-conductive connecting members in a step of mounting a light-emitting element in the method of manufacturing the light-emitting device according to the first embodiment.
Figure 5B:
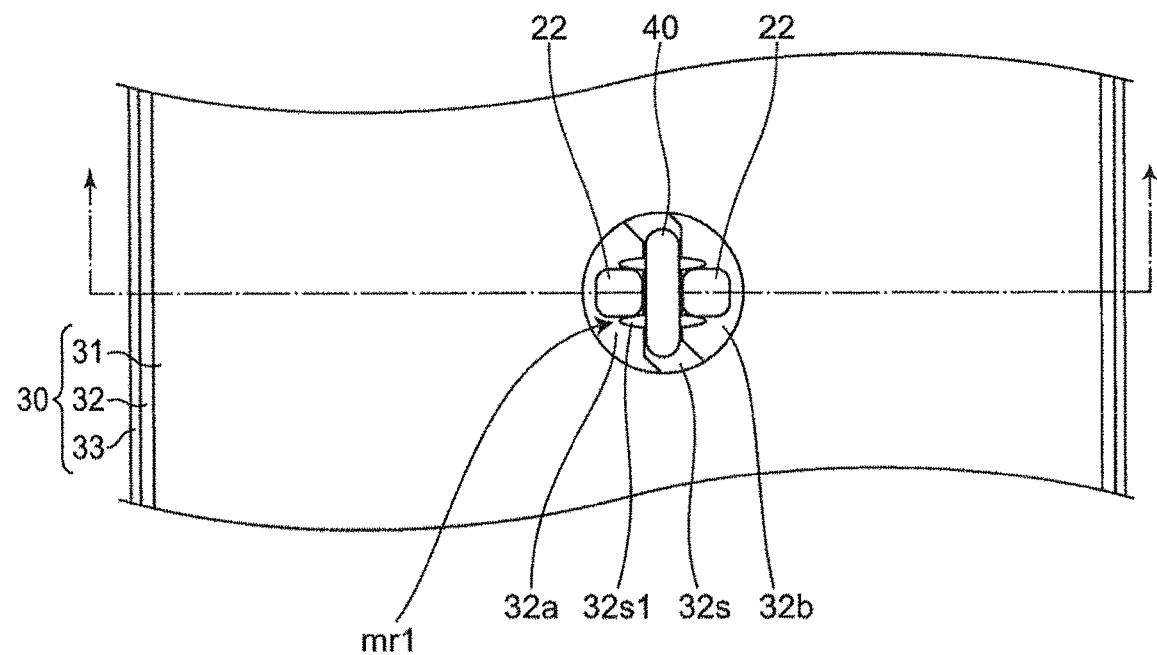
FIG. 5B is a schematic plan view shown after forming the electrically-conductive connecting members in the step of mounting the light-emitting element in the method of manufacturing the light-emitting device according to the first embodiment.

The electrically-conductive connecting members 22 are formed by, for example, applying solder paste (i.e., cream solder) in patterns by screen printing respectively on the first wiring 32a between the two notches 32s1 and on the second wiring 32b between the two notches 32s1 exposed in the mounting region mr1, as shown in FIG. 5A and FIG. 5B.

Figure 6A:
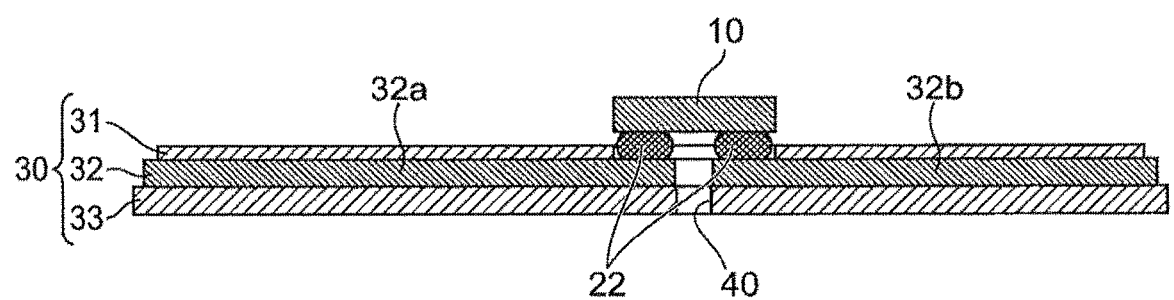
FIG. 6A is a schematic sectional view shown after mounting a light-emitting element in a step of mounting the light-emitting element in the method of manufacturing the light-emitting device according to the first embodiment.
Figure 6B:
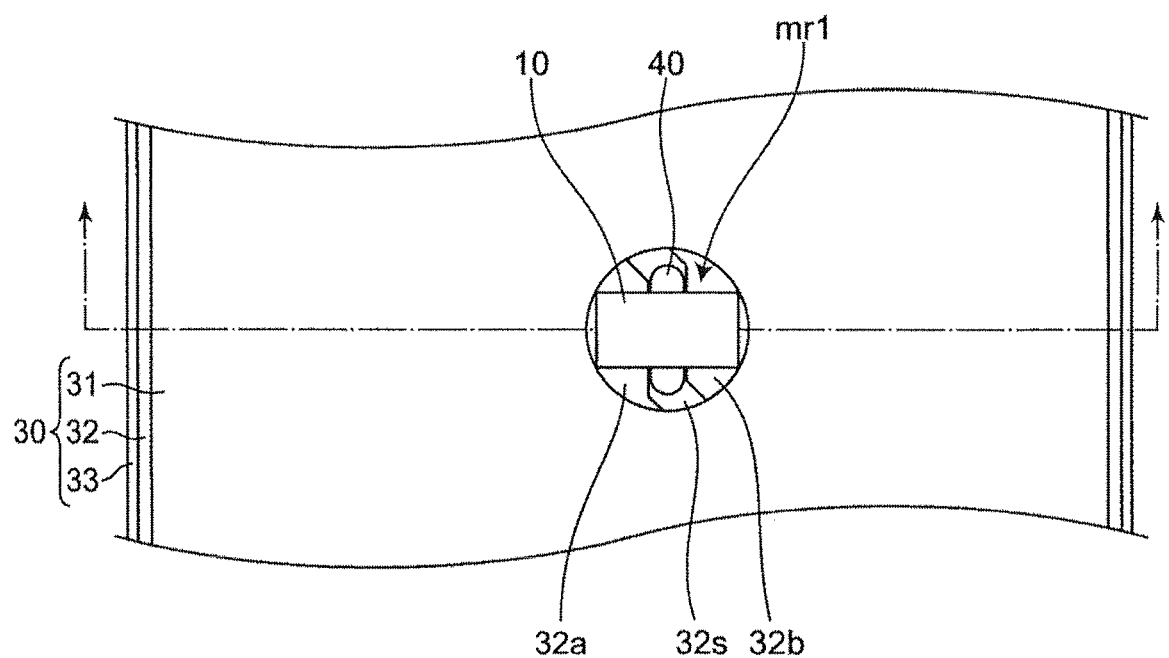
FIG. 6B is a schematic plan view shown after mounting the light-emitting element in the step of mounting the light-emitting element in the method of manufacturing the light-emitting device according to the first embodiment.

After the electrically-conductive connecting members 22 are formed, as shown in FIG. 6A and FIG. 6B, the light-emitting element 10 is placed with, for example, a chip mounted such that the positive electrode faces the electrically-conductive connecting member 22 on the first wiring 32a and that the negative electrode faces the electrically-conductive connecting member 22 on the second wiring 32b, and the electrically-conductive connecting members 22 are melted with heat.

This operation respectively connects the positive and negative electrodes of the light-emitting element 10 to the first wiring 32a and the second wiring 32b. The heating can be performed by, for example, passing the product through a reflow oven in a $N_2$ atmosphere. The solder paste thus melts and can provide the self-alignment effect due to surface tension of the molten solder offered by the notches 32s1 on both sides of the solder paste, so that the light-emitting element 10 is flip-chip mounted with high precision of position.

Providing Cover Member

Subsequently, a first metal mold 51 that serves as a cover member is provided. The first metal mold 51 has a concave portion 51r that accommodates the light-emitting element 10. A second metal mold 52 having a resin pouring hole 52h is also provided.

Disposing Cover Member

Subsequently, the substrate 30 on which the light-emitting element 10 has been mounted is disposed with the light-emitting element 10 facing down between the first metal mold 51 having the concave portion 51r for accommodating the light emitting element 10 and the second metal mold 52 having the resin pouring hole 52h.

Figure 7:
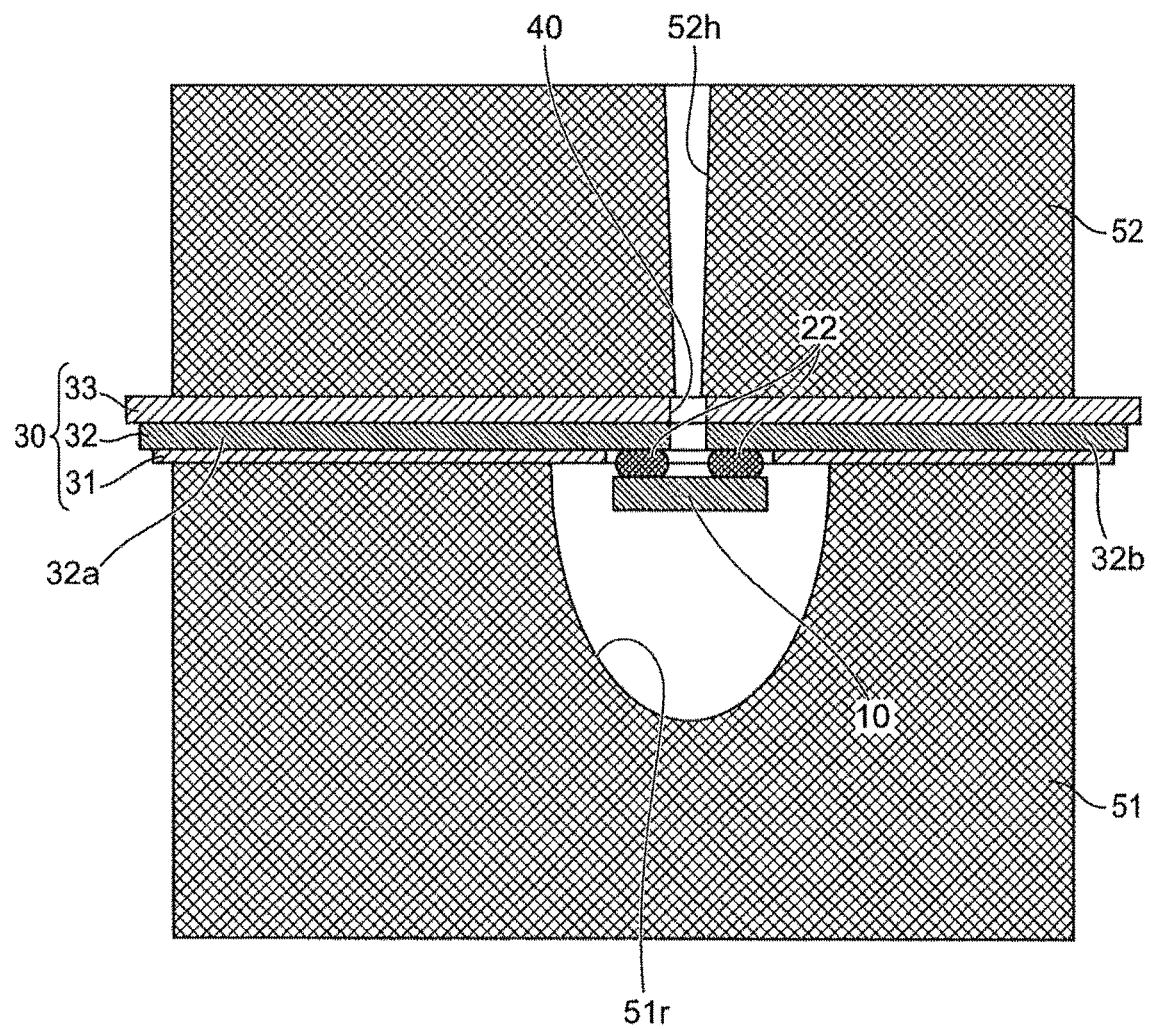
FIG. 7 is a schematic sectional view shown after disposing metal molds in a step of forming a light-transmissive resin in the method of manufacturing the light-emitting device according to the first embodiment.

Specifically, the first metal mold 51 has, for example, the concave portion 51r having a lens-like shape corresponding to the light-transmissive resin 20 and is disposed so as to face the first surface of the substrate 30 such that the light-emitting element 10 mounted on the substrate 30 is accommodated in the concave portion 51r as shown in FIG. 7. For example, the first metal mold 51 is disposed such that the central axis of the concave portion 51r coincides with the central axis (i.e., optical axis) of light distribution of the light-emitting element 10. The second metal mold 52 is disposed so as to face the second surface of the substrate 30 such that the resin pouring hole 52h leads to the through-hole 40 of the substrate 30.

Forming Light-Transmissive Resin

Figure 8:
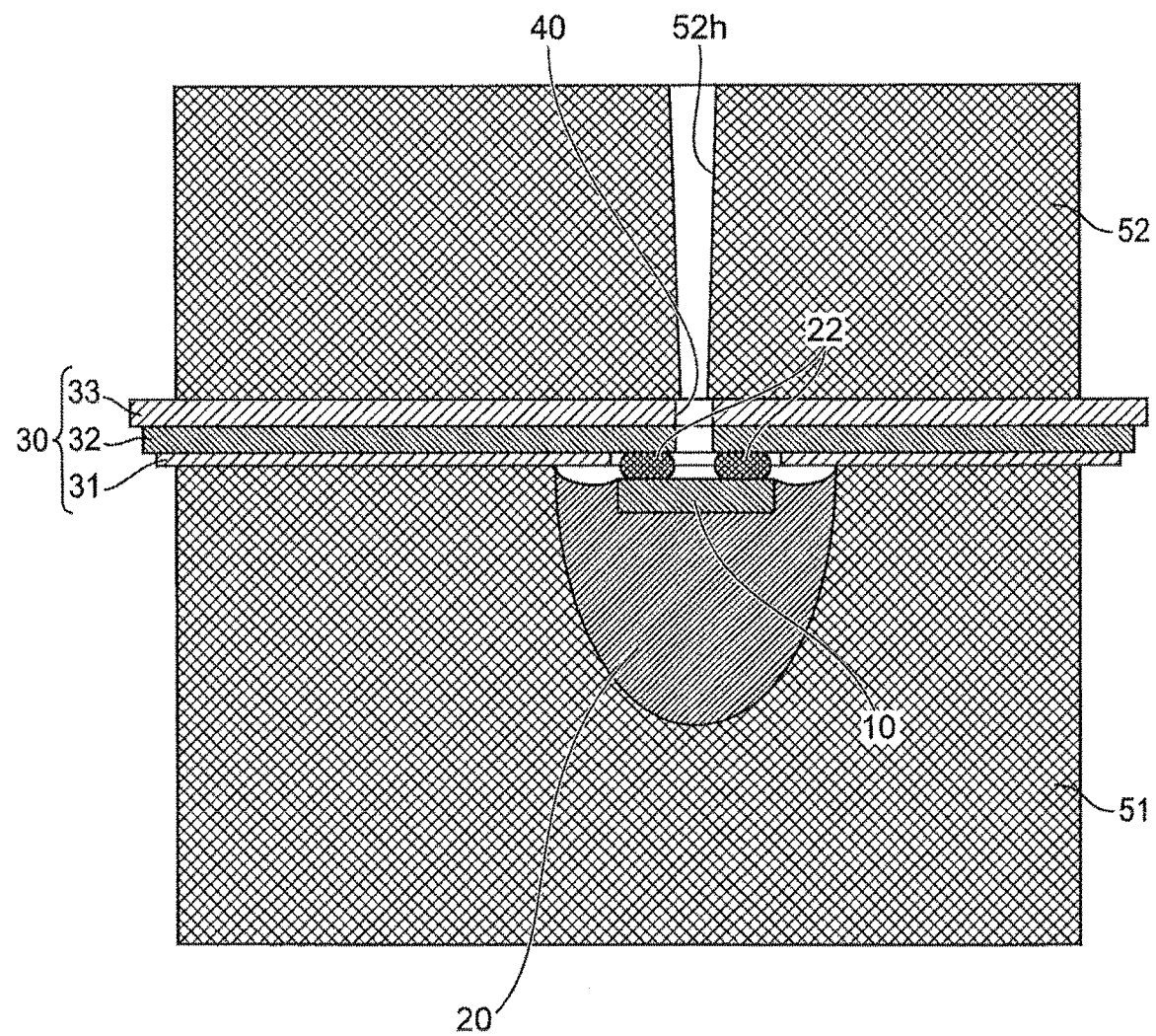
FIG. 8 is a schematic sectional view shown after injecting a light-transmissive resin material through a resin pouring hole 52h and a through-hole 40 in the light-transmissive resin forming step in the method of manufacturing the light-emitting device according to the first embodiment.

As shown in FIG. 8, the light-transmissive resin material is injected into the concave portion 51r of the first metal mold 51 through the resin pouring hole 52h of the second metal mold 52 and the through-hole 40 of the substrate 30, with the first metal mold 51 and the second metal mold 52 facing each other via the substrate 30.

The light-transmissive resin material is preferably injected into the concave portion 51r from both ends of the through-hole 40 in the longitudinal direction viewed from the top. The amount of the light-transmissive resin material injected is large enough to let the surface of the light-transmissive resin material after being injected be near the bottom surface of the light-emitting element 10. The bottom surface of the light-emitting element is the surface close to the substrate 30, in other words, the surface on which the electrically-conductive connecting members 22 are disposed. For example, a light-transmissive resin material capable of defining a contact angle of about 45° with respect to the lateral surface of the light-emitting element 10 can be used, and the light-transmissive resin can cover the lateral surfaces of the semiconductor multilayer film including the active layer located near the lower ends of the lateral surfaces of the light-emitting element 10. This structure allows light perpendicularly emitted from the lateral surfaces of the active layer to be reflected by the surface (i.e., interface) of the light-transmissive resin to change the direction of emission of the light to the upward direction, thereby enhancing the light extraction efficiency. Adjusting the material and amount of the light-transmissive resin material injected enables the reflective resin 21 to be formed into a desired shape by cast molding.

After the light-transmissive resin material is injected into the concave portion 51r, the light-transmissive resin material injected is cured. When the light-transmissive resin material is cured, the light-transmissive resin material shrinks (for example, by 2 vol % to 4 vol %), and the surface of the light-transmissive resin, which faces the substrate 30 becomes depressed at a position away from the inner circumference of the light-emitting element 10 and the outer circumference of the light-transmissive resin to make a cavity between the first surface of the substrate 30 and the surface of the light-transmissive resin facing the substrate 30. In other words, the contact angle between a lateral surface of the light-emitting element 10 and the light-transmissive resin becomes smaller than the contact angle at the time of injection of the light-transmissive resin material, and becomes less than 90°. This cavity is what is called a "sink mark", which is usually prevented from being formed in a resin forming step with some countermeasure. The method of manufacturing the light-emitting device 100 according to the first embodiment, however, take advantage of this "sinkage" to easily and simply control the shape of the reflective resin. By utilizing the "sinkage" and the contact angle of 90° or less between the light-transmissive resin material and the lateral surface of the light-emitting element 10, a spreading region can be created near the light-emitting element in the cavity. In the spreading region, the distance between the substrate 30 and the surface of the light-transmissive resin facing the substrate 30 increases as the distance from the light-emitting element 10 increases. The amount of the light-transmissive resin material injected into the concave portion 51r, the dwell during the injection, and the like can be selected to form a cavity between the substrate 30 and the light-transmissive resin 20 in consideration of the shrinkage factor at the time of curing of the light-transmissive resin material. The cavity can be formed so as to have a shape corresponding to a desired shape of the reflective resin 21 after being cured.

Injecting Reflective Resin

Figure 9:
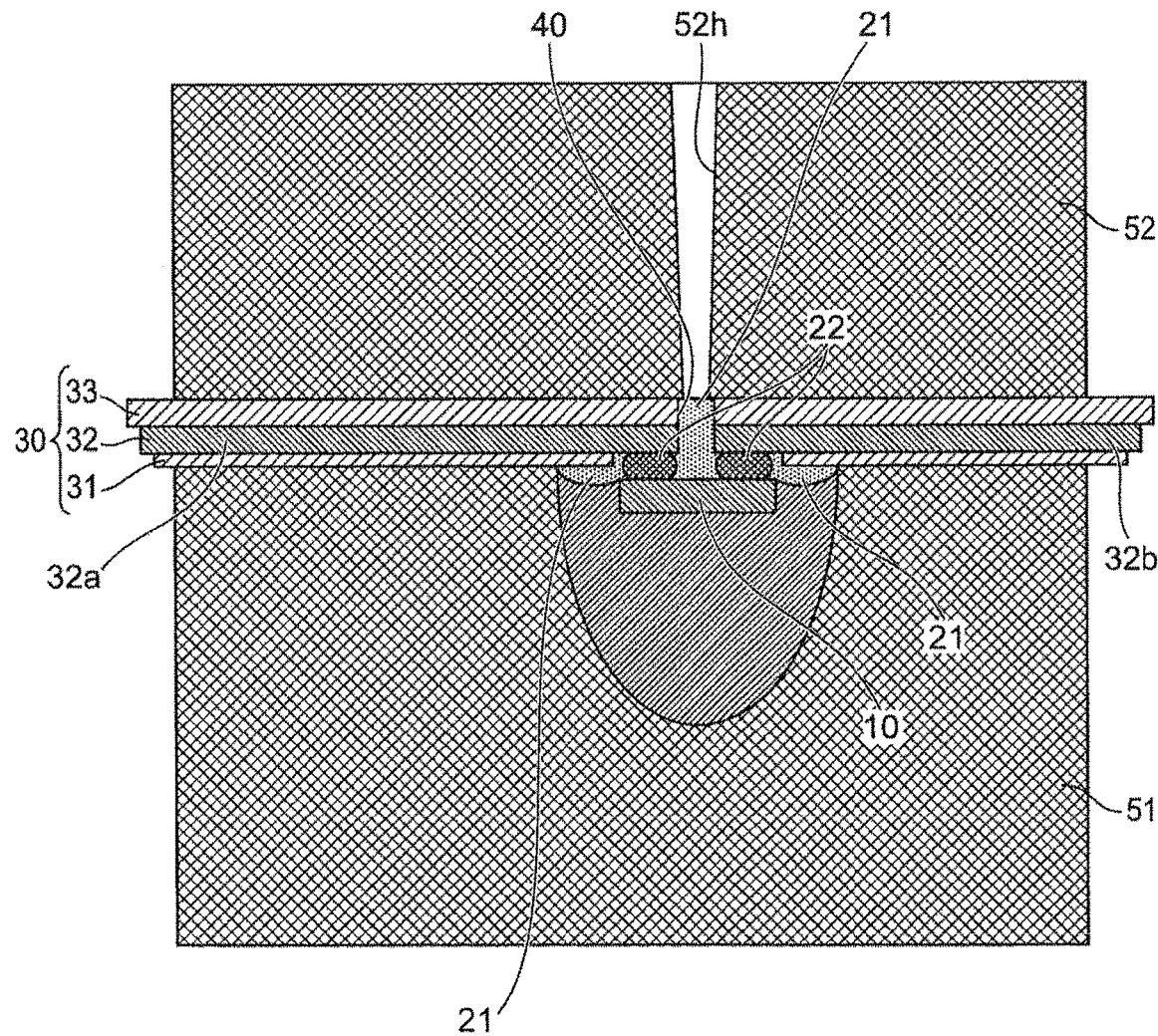
FIG. 9 is a schematic sectional view shown after injecting a reflective resin material through the resin pouring hole 52h and the through-hole 40 in a step of forming a reflective resin in the method of manufacturing the light-emitting device according to the first embodiment.

As shown in FIG. 9, the reflective resin material is filled into the cavity, the space between the cavity and the through-hole 40, and into the through-hole 40 of the substrate 30. The reflective resin material is injected through the resin pouring hole 52h of the second metal mold 52. In the manufacturing method according to the first embodiment, the injected reflective resin material radially spreads from the through-hole 40 because the reflective resin material is injected through the through-hole 40 located at the center of the cavity. Hence, air or voids are less likely to be trapped between the light-emitting element 10 and the substrate 30, and the injection into the cavity can be easily carried out with less unevenness in the shape. The reflective resin material is preferably injected from, for example, the center of the through-hole 40 (i.e., central axis of the through-hole 40) in the longitudinal direction viewed from the top. To inject the reflective resin material from the center of the through-hole 40 in the longitudinal direction and to inject the light-transmissive resin from both ends of the through-hole 40 in the longitudinal direction as described above, for example, a resin flow channel of the resin pouring hole 52h of the second metal mold 52 is designed to be switchable between a flow channel through which the reflective resin material is injected and a flow channel through which the light-transmissive resin is injected.

After the reflective resin material is cured, the light-emitting device is removed from the first metal mold 51 and the second metal mold 52.

As described above, in a step of shaping the light-transmissive resin in the method of manufacturing the light-emitting device 100 according to the first embodiment, the amount of the light-transmissive resin material injected is adjusted, in order to take advantage of shrinkage of the light-transmissive resin material after being cured, and the contact angle between the light-transmissive resin material and a lateral surface of the light-emitting element 10. Hence, the cavity, defined by the surface of the light-transmissive resin 20 facing the substrate 30, depressed at a position away from the light-emitting element 10 and the outer circumference of the light-transmissive resin can be formed between the first surface of the substrate 30 and the surface of the light-transmissive resin facing the substrate 30. The reflective resin material is then injected into the cavity to form the reflective resin 21. Accordingly, the light-transmissive resin 20 is formed such that the contact angle with the lateral surface of the light-emitting element 10 is less than 90°, and the reflective resin 21 is formed such that the contact angle with the lateral surface of the light-emitting element 10 is 90° or more. At this time, the first inclined region of the reflective resin 21 is formed in which the thickness of the reflective resin 21 increases as the distance from the light-emitting element 10 increases.

Accordingly, in a light-emitting device produced by the method of manufacturing the light-emitting device 100 according to the first embodiment, light emitted from the lateral surfaces of the light-emitting element 10 passes through the light-transmissive resin 20, is reflected by the reflective resin 21, and exits to the outside the light-emitting device, whereby the light extraction efficiency is enhanced.

On the other hand, the reflective resin can be formed inside the through-hole 40 and between the bottom surface of the light-emitting element 10 and the surface of the substrate 30 before the light-transmissive resin is formed. This will create the light-transmissive resin defining a contact angle of 90° or more with respect to a lateral surface of the light-emitting element 10, and the reflective resin defining a contact angle of less than 90° with respect to a lateral surface of the light-emitting element 10. Accordingly, the reflective resin covers the lateral surfaces of the semiconductor multilayer film including the active layer, thereby reducing the light extraction efficiency of the light-emitting device.

The base member 33 may be formed with a flexible substrate in which polyimide film is used as the base material. In such a case, the base member 33 of the substrate 30 exposed near the light-emitting element 10 is irradiated with light from the light-emitting element 10 at a high irradiation density and may be deteriorated due to absorption of the light, and its insulation performance may be degraded. However, in a light-emitting device produced by the method of manufacturing the light-emitting device 100 according to the first embodiment, the reflective resin 21 is filled into the through-hole 40 and optically separates the substrate 30 and the light-emitting element 10 to alleviate deterioration of the substrate 30. This structure enables even a substrate material that is comparatively easily deteriorated by light to be selected for thermal conductivity and flexibility of the substrate 30.

In the manufacturing method according to the first embodiment above, the cavity, depressed at a position away from the light-emitting element 10 and the outer circumference of the light-transmissive resin, is formed by utilizing the "sinkage" phenomenon occurring when the light-transmissive resin material is injected into the concave portion 51r of the first metal mold 51 and cured, and the reflective resin material is injected into the cavity.

However, in the manufacturing method according to the first embodiment, for example, it is also possible to select resin materials that are not mixed together at room temperature as the resin material for the light-transmissive resin 20 and the resin material for the reflective resin 21, and to inject the reflective resin material before curing the light-transmissive resin material. In this case, the "sinkage" phenomenon described above cannot be utilized, and a concave meniscus is utilized.

Specifically, a cavity (i.e., meniscus cavity) depressed to a predetermined depth at a position away from the light-emitting element 10 and the outer circumference of the light-transmissive resin material is formed between the first surface of the substrate 30 and the surface of the light-transmissive resin material facing the substrate 30 by, for example, controlling the viscosity and the amount of the light-transmissive resin material injected into the concave portion 51r of the first metal mold 51. The reflective resin material is then injected into the meniscus cavity before the light-transmissive resin material is cured or when the light-transmissive resin material is semi-cured. After the reflective resin material is injected, the light-transmissive resin material and the reflective resin material are cured.

The light-emitting device 100 according to the first embodiment can also be produced through the above procedure.

In the above manufacturing method according to the first embodiment, the light-transmissive resin material is injected into the concave portion 51r of the first metal mold 51 with the substrate 30 on which the light-emitting element 10 has been mounted being disposed between the first metal mold 51 and the second metal mold 52.

However, in the manufacturing method according to the first embodiment, the first metal mold 51 and the second metal mold 52 may be disposed on the opposite surfaces of the substrate 30 on which the light-emitting element 10 has been mounted after the light-transmissive resin material is injected into the concave portion 51r of the first metal mold 51. Also in this case, the cavity, depressed to a predetermined depth at a position away from the light-emitting element 10 and the outer circumference of the light-transmissive resin material, can be formed between the first surface of the substrate 30 and the surface of the light-transmissive resin material facing the substrate 30 by utilizing the "sink mark" or the "meniscus".

Second Embodiment

A light-emitting device according to a second embodiment has substantially the same structure as the light-emitting device 100 according to the first embodiment except that the substrate 30 has second through-holes 41 in addition to the through-hole 40 (referred to as a first through-hole in the second embodiment). In the light-emitting device according to the second embodiment, the through-hole 40 (i.e., first through-hole) is located at the same position and has the same shape as in the light-emitting device 100 according to the first embodiment.

In the light-emitting device according to the second embodiment, the second through-holes 41 are preferably disposed directly below the reflective resin 21. This structure facilitates injection of the resin when the reflective resin 21 is to be formed.

The following mainly describes parts of a method of manufacturing the light-emitting device according to the second embodiment that are different from the method of manufacturing the light-emitting device 100 according to the first embodiment.

In the method of manufacturing the light-emitting device according to the second embodiment, in the same manner as in the first embodiment, the first wiring 32a and the second wiring 32b separated from each other are formed on the first surface of the substrate 30 (see FIG. 2A and FIG. 2B) in the substrate providing step, and the insulating resin film 31 that covers the wiring layer 32 and the separating portion 32s is formed except for the mounting region mr1 on which the light-emitting element 10 is to be mounted (see FIG. 3A and FIG. 3B) in the step of forming the insulating resin film.

Subsequently, in a step of making through-holes, the first through-hole 40 formed through the substrate 30 from the first surface to the second surface is formed in the mounting region mr1 (see FIG. 4A and FIG. 4B) in the same manner as in the first embodiment, and the second through-holes 41 are formed in the following manner.

In the light-emitting device according to the second embodiment, at the time of forming the reflective resin 21, two second through-holes 41 are formed directly below the reflective resin 21 in order to facilitate the resin injection. The positions of the second through-holes 41 are selected to realize a high self-alignment effect when the light-emitting element 10 is to be mounted.

Figure 10A:
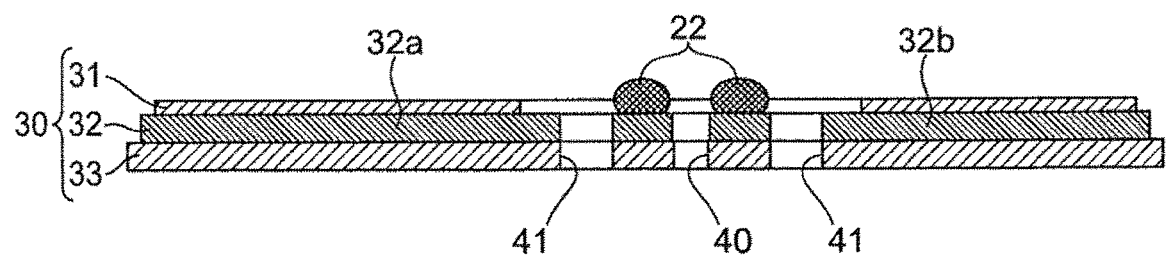
FIG. 10A is a schematic sectional view showing positions of second through-holes 41 formed in a substrate 30 of a light-emitting device according to a second embodiment.
Figure 10B:
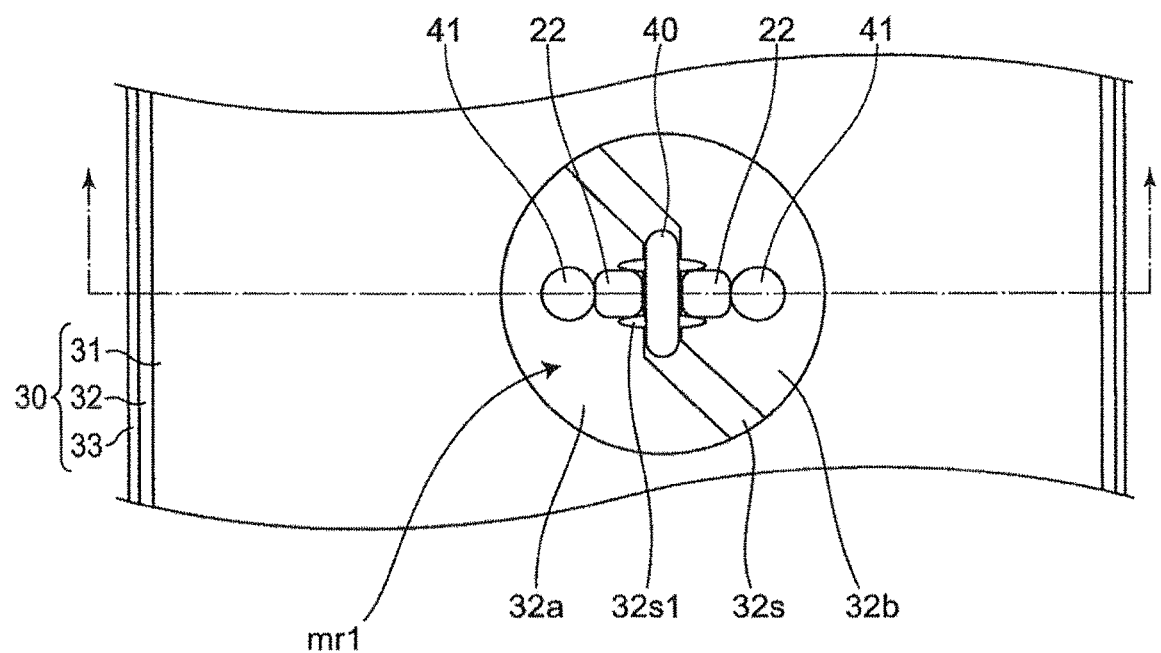
FIG. 10B is a schematic plan view showing the positions of the second through-holes 41 formed in the substrate 30 of the light-emitting device according to the second embodiment.

Specifically, for example, the two second through-holes 41 are formed with the first through-hole therebetween as shown in FIG. 10A and FIG. 10B. One of the second through-holes 41 is formed such that the second through-hole 41, the two notches 32s1 on the first wiring 32a, and the first through-hole 40 surround the region in which one of the electrically-conductive connecting members 22 is to be formed. The other second through-hole 41 is formed such that the second through-hole 41, the other two notches 32s1 on the second wiring 32b, and the first through-hole 40 surround the region in which another electrically-conductive connecting member 22 is to be formed.

Figure 11A:
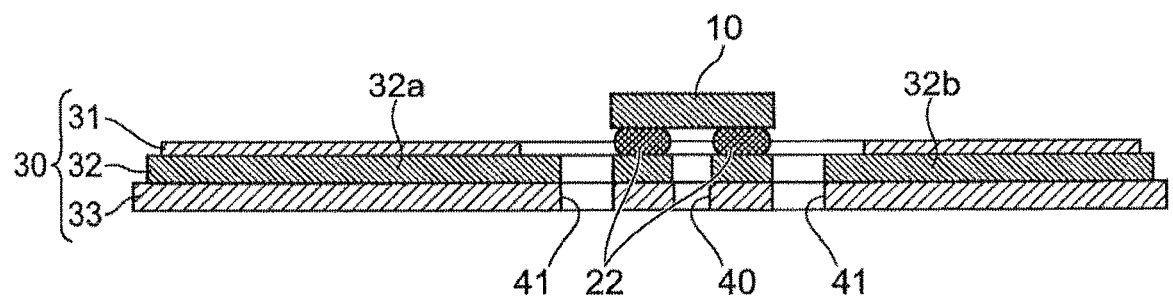
FIG. 11A is a schematic sectional view shown after mounting the light-emitting element 10 on the substrate 30 in the manufacturing of the light-emitting device according to the second embodiment.

After the second through-holes 41 are formed, the electrically-conductive connecting members 22 are respectively formed in the regions each surrounded by one of the second through-holes 41, two notches 32s1, and the first through-hole 40. The light-emitting element 10 is then connected via the connecting members 22 as shown in FIG. 11A and FIG. 11B.

After that, the light-transmissive resin 20 is formed, and the reflective resin 21 is then formed in the same manner as in the first embodiment.

Figure 12:
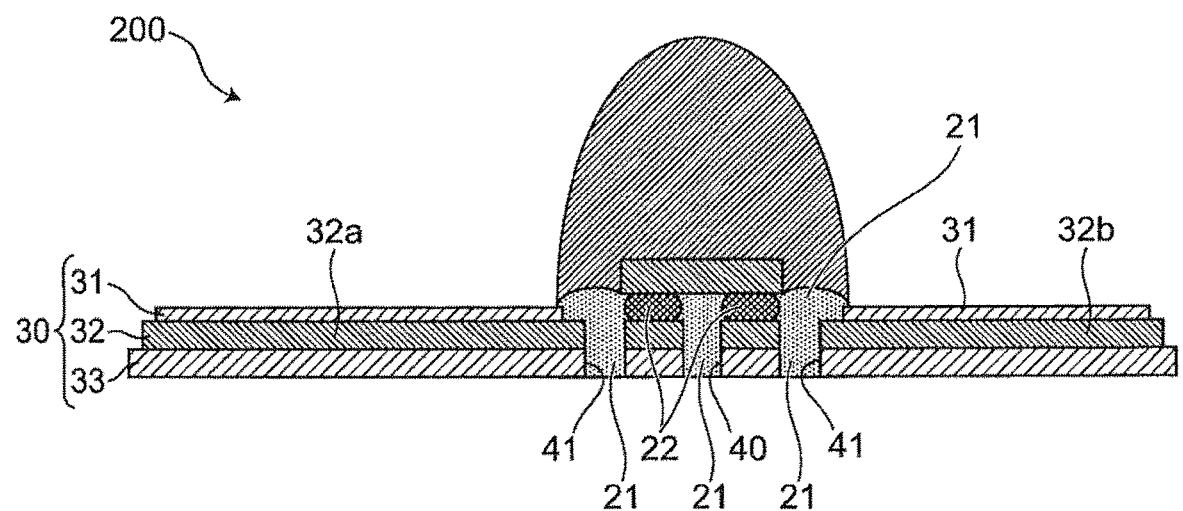
FIG. 12 is a schematic sectional view of the light-emitting device according to the second embodiment.

FIG. 12 shows the light-emitting device according to the second embodiment produced in the manner described above. The light-emitting device according to the second embodiment has the two second through-holes 41 on both sides of the light-emitting element 10 and directly below the reflective resin 21, and the reflective resin 21 can therefore be uniformly injected through the two second through-holes 41, thereby reducing injection time and facilitating formation of the reflective resin 21 with less unevenness in shape.

Figure 11B:
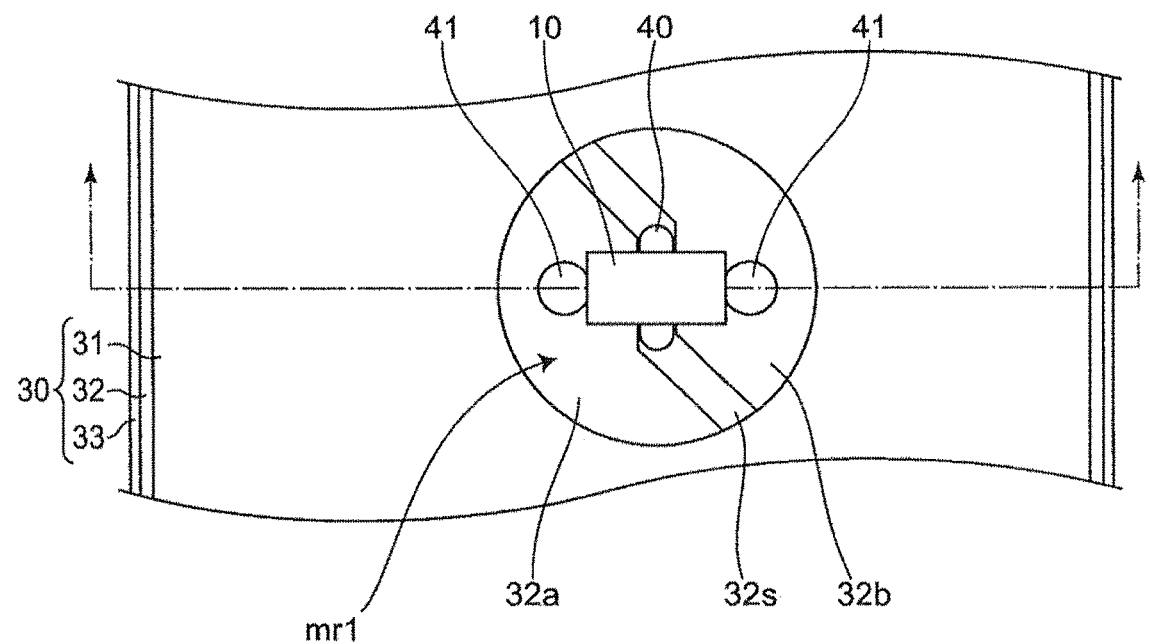
FIG. 11B is a schematic plan view shown after mounting the light-emitting element 10 on the substrate 30 in the manufacturing process of the light-emitting device according to the second embodiment.

The light-emitting device according to the second embodiment produced in the manner described above can have the self-alignment effect in two orthogonal directions, in other words, in both of the major axis direction and the minor axis direction of the light-emitting device having a rectangular shape in FIG. 11B. Hence, the light-emitting element 10 can be mounted with high precision of position.

Third Embodiment

Figure 13A:
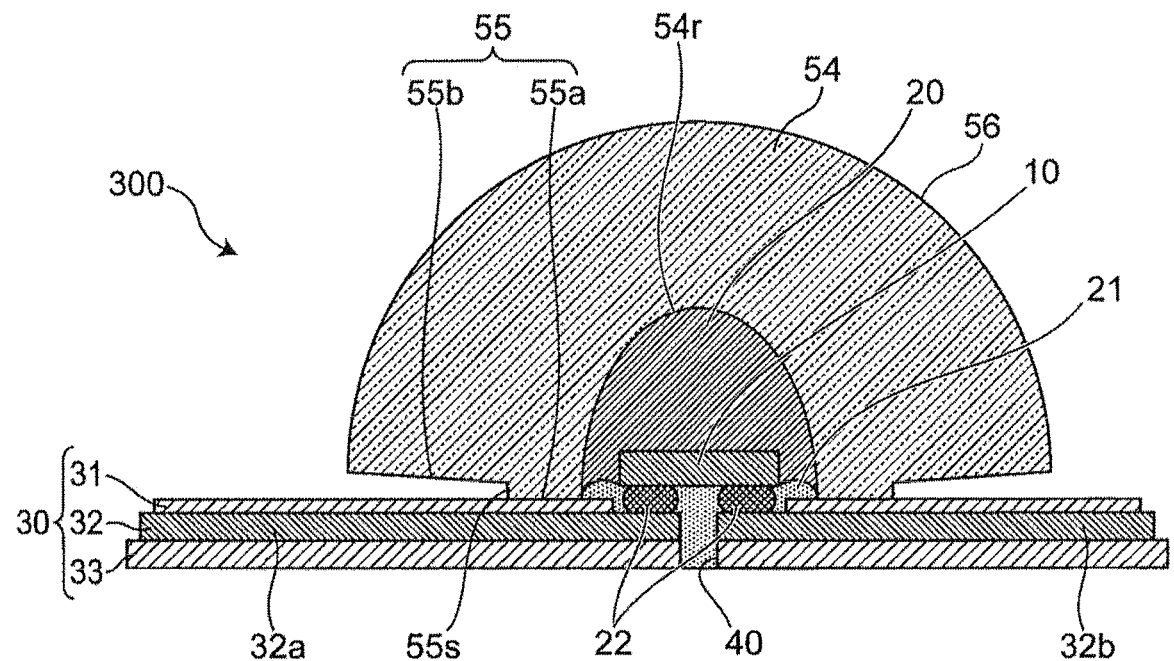
FIG. 13A is a schematic sectional view of a light-emitting device according to a third embodiment.
Figure 13B:
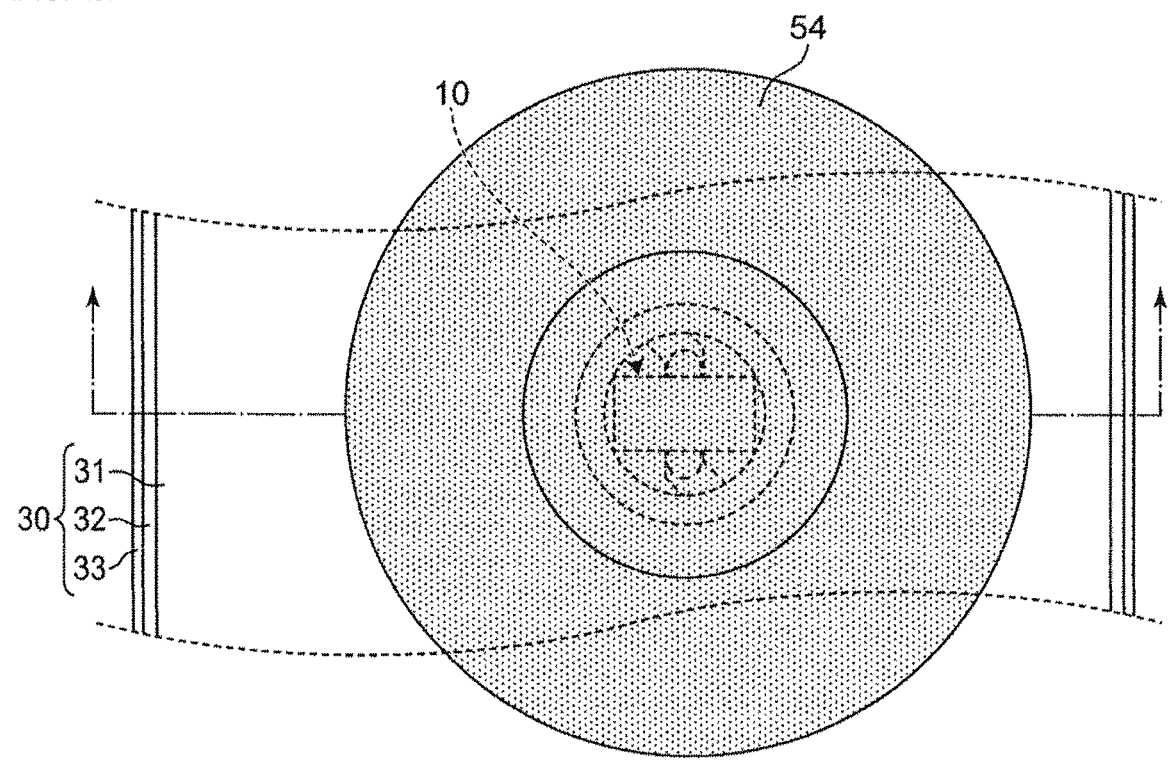
FIG. 13B is a schematic plan view of the light-emitting device according to the third embodiment.

As shown in FIG. 13A and FIG. 13B, a light-emitting device 300 according to a third embodiment includes a lens 54 with respect to the light-emitting device 100 according to the first embodiment.

The lens 54 has bottom surfaces 55, an emission surface 56 having a curved surface, and a concave portion 54r that accommodates the light-emitting element 10. The lens 54 also serves as the cover member. The bottom surfaces 55 of the lens 54 includes: an inner bottom surface 55a and an outer bottom surface 55b both facing the insulating resin film on the substrate 30. The inner bottom surface 55a is in contact with the insulating resin film 31 on the substrate 30. The outer bottom surface 55b is located outside the inner bottom surface 55a and inclined relative to the first surface of the substrate, and a height difference 55s is provided between the inner bottom surface 55a and the outer bottom surface 55b. The inner circumferential edge (edge of the concave portion 54r) of the inner bottom surface 55a of the lens 54 coincides with the lower end of the outer circumference of the light-transmissive resin 20.

The light-emitting device 300 according to the third embodiment having the above structure can provide various light distribution characteristics by appropriately changing the shape of the surface of the light-transmissive resin 20 and the shape of the emission surface 56 of the lens 54. Also, the bottom surface 55 of the lens 54 includes the outer bottom surface 55b inclined relative to the first surface of the substrate 30, light emitted along the first surface of the substrate 30 can be extracted upward by utilizing reflection of the outer bottom surface 55b, thereby improving the light extraction efficiency. In addition, as described below, the light-transmissive resin 20 and the reflective resin 21 of the light-emitting device 300 according to the third embodiment can be formed without the metal molds.

The light-emitting device 300 according to the third embodiment can have a structure in which a light-emitting element 10 formed by layering a plurality of nitride semiconductor layers on a sapphire substrate is flip-chip mounted. In such a case, light can pass through the nitride semiconductor layers having a refractive index of 2.3 to 2.6, the sapphire substrate, the light-transmissive resin 20, and the lens 54, in this order in the direction of exiting light. This order corresponds to the order of higher refractive indices to lower refractive indices so as to become closer to 1, which is the refractive index of air. This can improve light extraction efficiency of the light-emitting device 300. As a specific example, the light-transmissive resin 20 is formed using an epoxy resin, which has a refractive index of about 1.5 to 1.6, and the lens 54 is formed using an acrylic resin, which has a refractive index of 1.5.

The following mainly describes parts of a method of manufacturing the light-emitting device 300 according to the third embodiment that are different from the method of manufacturing the light-emitting device 100 according to the first embodiment.

In the method of manufacturing the light-emitting device according to the third embodiment, the step of providing substrate and the step of mounting are the same as or similar to those in the first embodiment, but a member produced by, for example, the lens 54 serving as the cover member is formed by a mold made of resin in the method of manufacturing the light-emitting device according to the third embodiment. The lens 54 is shaped such that the emission surface 56 has a predetermined shape and that the concave portion 54r having a shape, such as a lens-like shape, substantially corresponding to the shape of the light-transmissive resin 20 is formed.

Subsequently, the light-transmissive resin material is injected into the concave portion 54r of the lens 54 provided. The substrate 30 on which the light-emitting element 10 has been mounted is aligned. The lens 54 is fixed to the substrate 30 such that the light-emitting element 10 is immersed in the light-transmissive resin material and that the inner bottom surface 55a of the lens 54 is in intimate contact with the insulating resin film 31.

After the light-transmissive resin material is cured, the reflective resin material is injected into the cavity formed by sinkage and depressed to a predetermined depth at a position away from the light-emitting element 10 and the outer circumference of the light-transmissive resin and cured to form the reflective resin 21.

In the method of manufacturing the light-emitting device according to the third embodiment, it is also possible to select resin materials that are not mixed together as the light-transmissive resin material and the reflective resin material, and take advantage of a meniscus cavity depressed to a predetermined depth at a position away from the light-emitting element 10 and the outer circumference of the light-transmissive resin. In such a case, the reflective resin material is injected into a meniscus cavity, before the light-transmissive resin material is cured or when the light-transmissive resin is semi-cured.

The light-emitting device 300 according to the third embodiment can be produced through the above procedure.

Fourth Embodiment

Figure 14:
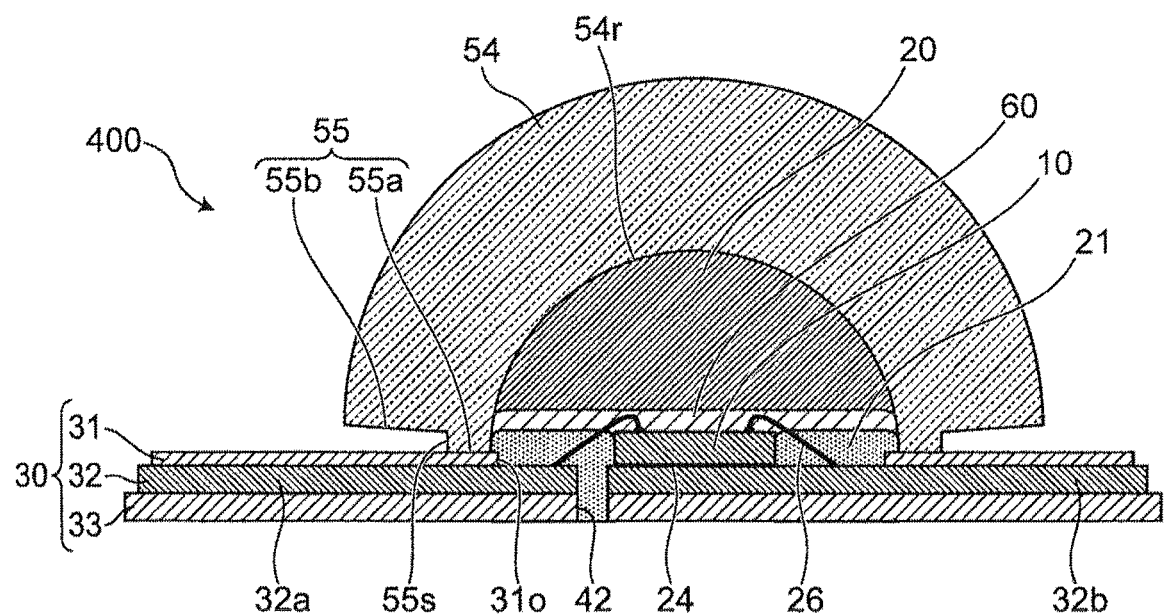
FIG. 14 is a schematic sectional view of a light-emitting device according to a fourth embodiment.

As shown in FIG. 14, a light-emitting device 400 according to a fourth embodiment differs from the light-emitting device 300 according to the third embodiment in that:

(a) a light-emitting element 10 for face-up mounting is die-bonded to the second wiring 32b, the positive electrode of the light-emitting element 10 is connected to the first wiring 32a by wire bonding, and the negative electrode of the light-emitting element 10 is connected to the second wiring 32b by wire bonding;

(b) a phosphor layer 60 that absorbs part of light emitted from the light-emitting element 10 and emits light having a wavelength longer than the wavelength of the light emitted from the light-emitting element 10 is disposed between the light-transmissive resin 20 and the emitting surface of the light-emitting element 10;

(c) the reflective resin 21 covers the lateral surfaces of the light-emitting element 10 except for the region the upper ends and its vicinity of the lateral surfaces; and (d) a through-hole 42 is formed in the separating portion 32s near the light-emitting element 10.

Other than the points (a) to (d) above, the structure employed in the fourth embodiment is the same as or similar to that of the light-emitting device 300 according to the third embodiment.

The light-emitting device 400 according to the fourth embodiment having the above structure has effects similar to the effects of the light-emitting device 300 according to the third embodiment.

Also, the light-emitting device 400 according to the fourth embodiment includes the phosphor layer 60 and can emit, for example, white light as a mixture of light emitted from the light-emitting element 10 and light emitted from the phosphor layer 60.

In addition, the reflective resin 21 covers the lateral surfaces of the light-emitting element 10 in the light-emitting device 400 according to the fourth embodiment. Therefore, most of light to be emitted from the light-emitting element 10 exits from the emitting surface, which is the upper surface, of the light-emitting element. This structure can facilitate design light distribution using the light-transmissive resin 20 and the lens 54 and suppress stray light that is not extracted from the light-emitting device 400.

The following mainly describes different part of a method of manufacturing the light-emitting device 400 according to the fourth embodiment shown in FIG. 14 from the method of manufacturing the light-emitting device according to the third embodiment.

In the step of providing substrate, the opening 31o of the insulating resin film 31 is formed such that the exposed area of the second wiring 32b is larger than the exposed area of the first wiring 32a in consideration of placement of the light-emitting element 10 on the second wiring 32b. Here, for example, a placing region, in which the light-emitting element 10 is to be placed on the second wiring 32b and the opening 31o are formed such that the center of the placing region coincides with the center of the opening 31o in the top view.

The through-hole 42 is then formed in the separating portion 32s that separates the first wiring 32a from the second wiring 32b.

In the method of manufacturing the light-emitting device 400 according to the fourth embodiment, the light-emitting element 10 for face-up mounting is provided by, for example, growing an n-type nitride semiconductor layer, an active layer formed using a nitride semiconductor, and a p-type nitride semiconductor layer on a sapphire substrate, and forming a negative electrode having ohmic contact with the n-type nitride semiconductor layer as well as a positive electrode having ohmic contact with the p-type nitride semiconductor layer on the same surface (i.e., emitting surface).

In the step of mounting a light-emitting element, the light-emitting element 10 for face-up mounting is fixed to the placing region on the substrate 30 provided in the step of providing substrate, using a die-bonding paste as a connecting member 24. Subsequently, the positive electrode of the light-emitting element 10 is connected to the first wiring 32a via a wire 26, and the negative electrode is connected to the second wiring 32b via another wire 26.

In a step of injecting a light-transmissive resin, the light-transmissive resin material (referred to as a first light-transmissive resin material in the fourth embodiment) is injected into the concave portion 54r of the lens 54 and pre-cured (i.e., semi-cured). At this time, the distance between the surface of the pre-cured first light-transmissive resin material positioned near the substrate and the edge of the concave portion 54r (i.e., surface in contact with the substrate 30) is slightly larger than the distance between the first surface of the substrate 30 and the tops of the wires. After that, the light-transmissive resin material (referred to as a second light-transmissive resin material in the fourth embodiment) containing phosphor particles serving as the wavelength conversion member is injected on top of the semi-cured first light-transmissive resin material in the concave portion 54r. The second light-transmissive resin material absorbs light emitted from the light-emitting element 10 and emits light having a wavelength longer than the wavelength of the light emitted from the light-emitting element 10. The distance between the surface of the second light-transmissive resin material positioned near the substrate and the edge of the concave portion 54r is substantially equal to the difference in height between the first surface (i.e., upper surface) of the substrate 30 and the upper surface of the sapphire substrate, which is the support substrate, of the light-emitting element 10. This structure is employed to bring the emitting surface of the light-emitting element 10 into contact with the second light-transmissive resin material in the subsequent disposing step.

Subsequently, the lens 54 in which the first light-transmissive resin material and the second light-transmissive resin material have been injected into the concave portion 54r is aligned with the substrate 30 on which the light-emitting element 10 has been mounted. The lens 54 is then fixed to the substrate 30 with an adhesive or the like such that the emitting surface of the light-emitting element 10 is immersed in the second light-transmissive resin material in the concave portion 54r. In this state, the second light-transmissive resin material is pre-cured. A cavity depressed to a predetermined depth at a position away from the light-emitting element 10 and the outer circumference of the second light-transmissive resin material is formed between the surface of the second light-transmissive resin material and the first surface of the substrate 30 because of sinkage due to pre-curing of the first and second light-transmissive resin materials and/or the concave meniscus phenomenon that occurs when the first and second light-transmissive resin materials are injected.

In the step of injecting the reflective resin, the reflective resin material is injected into and fills the through-hole 42 of the substrate 30 and the cavity between the surface of the second light-transmissive resin material and the first surface of the substrate.

After the reflective resin material is injected, the first and second light-transmissive resin materials and the reflective resin material are fully cured.

The light-emitting device 400 according to the fourth embodiment can be produced through the above procedure.

The light-emitting devices according to the present disclosure can be widely used for lighting apparatuses, light-emitting devices for vehicles, displays, indicators, indicator lights for handrails and staircases, lights for utility poles and streetlights, agricultural lighting devices attached to plants, accessories, security equipment, backlight devices for advertisements, and various structures.

What is claimed is:

1. A method of manufacturing a light-emitting device, the method comprising:
    providing a substrate having a first surface and a second surface opposite to the first surface, the substrate comprising:
        a first through-hole extending from the first surface to the second surface, and
        wiring at the first surface;
    mounting a light-emitting element on the substrate at a first surface side of the substrate to electrically connect an electrode of the light-emitting element and the wiring;
    providing a cover member comprising a concave portion for accommodating the light-emitting element;
    disposing the cover member such that the cover member faces the first surface of the substrate and the concave portion accommodates the light-emitting element and leads to the first through-hole;
    forming a light-transmissive resin in the concave portion such that a cavity is formed between (i) part of the first surface of the substrate around the light-emitting element and (ii) the light-transmissive resin; and
    injecting a reflective resin material into the cavity and the first through-hole.

2. The method of manufacturing a light-emitting device according to claim 1, wherein:
    the light-transmissive resin has a surface near the substrate, and
    the cavity comprises a region in which a distance between the substrate and the surface of the light-transmissive resin increases as a distance from the light-emitting element increases.

3. The method of manufacturing a light-emitting device according to claim 1, wherein the step of forming the light-transmissive resin comprises:
    after the step of disposing the cover member, injecting a light-transmissive resin material into the concave portion through the first through-hole; and
    curing the injected light-transmissive resin material.

4. The method of manufacturing a light-emitting device according to claim 1, wherein the light-transmissive resin material is cured after the step of injecting the reflective resin material.

5. The method of manufacturing a light-emitting device according to claim 1, wherein:
    the substrate comprises a second through-hole,
    the light-transmissive resin material is injected through the first through-hole, and
    the reflective resin material is injected through the second through-hole.

6. The method of manufacturing a light-emitting device according to claim 1, wherein the step of forming the light-transmissive resin comprises injecting a light-transmissive resin material into the concave portion before the step of disposing the cover member.

7. The method of manufacturing a light-emitting device according to claim 6, wherein the substrate is disposed above the cover member in the step of disposing the cover member after the light-transmissive resin material is injected.

8. The method of manufacturing a light-emitting device according to claim 1, wherein the cover member comprises a first metal mold comprising the concave portion.

9. The method of manufacturing a light-emitting device according to claim 8, wherein:
    a second metal mold comprising a resin pouring hole leading to the through-hole is disposed to face the first metal mold, and
    the light-transmissive resin material and the reflective resin material are injected through the resin pouring hole.

10. The method of manufacturing a light-emitting device according to claim 1, wherein the cover member comprises a lens comprising the concave portion.

11. The method of manufacturing a light-emitting device according to claim 1, wherein the substrate is a flexible substrate.

12. A light-emitting device comprising:
    a substrate having a first surface and a second surface opposite to the first surface, the substrate comprising:
        an electrically insulating base member, and
        an electrically conductive wiring layer disposed on the electrically insulating base member,
        wherein a through-hole extends through the electrically insulating base member and the electrically conductive wiring layer, from the first surface to the second surface;
    a light-emitting element disposed on the electrically conductive wiring layer at a first surface side of the substrate;
    a light-transmissive resin disposed on or above the first surface of the substrate to cover the light-emitting element; and
    a reflective resin disposed between the substrate and the light-transmissive resin and on part of the first surface of the substrate around the light-emitting element, wherein the reflective resin extends into the through-hole, is in contact with the light-emitting element, and comprises a region that is located outward of an outermost lateral surface of the light-emitting element in a plan view, in which a thickness of the region of the reflective resin increases as a distance from the outermost lateral surface of the light-emitting element increases.

13. The light-emitting device according to claim 12, wherein a lower end of a lateral surface of the light-emitting element substantially coincides with an upper end of an inner circumferential edge of the reflective resin.

14. The light-emitting device according to claim 12, wherein the reflective resin comprises a region in which a thickness of the reflective resin increases as a distance from an outer circumferential edge of the reflective resin increases.

15. The light-emitting device according to claim 14, wherein a lower end of the outer circumferential edge of the reflective resin substantially coincides with a lower end of an outer circumference of the light-transmissive resin.

16. The light-emitting device according to claim 12, wherein, in a top view, a central axis of the through-hole substantially coincides with a central axis of the light-transmissive resin.

17. The light-emitting device according to claim 12, wherein a central axis of light distribution of the light-emitting element substantially coincides with a central axis of the light-transmissive resin.

18. The light-emitting device according to claim 12, wherein the light-transmissive resin has a lens-like shape.

19. The light-emitting device according to claim 12, wherein:
the light-emitting element is flip-chip bonded to the first surface of the substrate with a bump, and
the bump is embedded in the reflective resin.

20. The light-emitting device according to claim 12, wherein the light-emitting device further comprises a phosphor layer between an emitting surface of the light-emitting element and the light-transmissive resin, the phosphor layer absorbing at least part of light emitted from the light-emitting element and emitting light having a wavelength longer than a wavelength of the light emitted from the light-emitting element.

21. The light-emitting device according to claim 12, wherein the substrate is a flexible substrate.

22. The light-emitting device according to claim 12, wherein a lowermost surface of the light-emitting device is formed by a lowermost surface of the electrically insulating base member and a lowermost surface of the reflective resin.

23. The light-emitting device according to claim 12, wherein the substrate further comprises an electrically insulating resin film disposed on the electrically conductive wiring layer.

24. The light-emitting device according to claim 12, wherein:
the electrically conductive wiring layer comprises a first wiring and a second wiring that are separated from each other by a separating portion, and
a part of the through hole that extends through the electrically conductive wiring layer is a part of the separating portion.

25. The light-emitting device according to claim 24, wherein:
at least one first notch is formed so as to extend into the first wiring from the separating portion in a top view, and
at least one second notch is formed so as to extend into the second wiring from the separating portion in the top view.

26. A light-emitting device comprising:
a substrate having a first surface and a second surface opposite to the first surface, wherein a through-hole extends through the substrate from the first surface to the second surface;
a light-emitting element disposed on the substrate at a first surface side of the substrate;
a light-transmissive resin disposed on or above the first surface of the substrate to cover the light-emitting element; and
a reflective resin disposed between the substrate and the light-transmissive resin and on part of the first surface of the substrate around the light-emitting element, wherein the reflective resin extends into the through-hole, is in contact with the light-emitting element, and comprises a region in which a thickness of the reflective resin increases as a distance from the light-emitting element increases,
wherein a position of an uppermost portion of the reflective resin is at a location spaced from the light-emitting element, and a height of the uppermost portion of the reflective resin from a surface of the substrate on which the light-emitting element is mounted is less than a height of an upper surface of the light-emitting element from the surface of the substrate on which the light-emitting element in mounted.

\* \* \* \* \*